United States Patent
Itou et al.

(10) Patent No.: US 11,316,070 B2
(45) Date of Patent: Apr. 26, 2022

(54) ILLUMINATION DEVICE AND DISPLAY DEVICE

(71) Applicant: Japan Display Inc., Tokyo (JP)

(72) Inventors: Osamu Itou, Tokyo (JP); Masanobu Ikeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/317,067

(22) Filed: May 11, 2021

(65) Prior Publication Data

US 2021/0265532 A1  Aug. 26, 2021

Related U.S. Application Data

(63) Continuation of application No. PCT/JP2019/036587, filed on Sep. 18, 2019.

(30) Foreign Application Priority Data

Nov. 15, 2018 (JP) .............................. JP2018-214927

(51) Int. Cl.
| | |
|---|---|
| *H01L 33/38* | (2010.01) |
| *G02F 1/1335* | (2006.01) |
| *H01L 25/075* | (2006.01) |
| *H01L 33/50* | (2010.01) |
| *H01L 33/58* | (2010.01) |

(52) U.S. Cl.
CPC ........ *H01L 33/38* (2013.01); *G02F 1/133616* (2021.01); *H01L 25/0753* (2013.01); *H01L 33/505* (2013.01); *H01L 33/58* (2013.01)

(58) Field of Classification Search
None
See application file for complete search history.

(56) References Cited

U.S. PATENT DOCUMENTS

2013/0248915 A1  9/2013  Shimada et al.

FOREIGN PATENT DOCUMENTS

| JP | H09-148629 A | 6/1997 |
|---|---|---|
| JP | 2010-243539 A | 10/2010 |
| JP | 2013-110052 A | 6/2013 |
| JP | 2013-218057 A | 10/2013 |
| JP | 2013-225640 A | 10/2013 |

OTHER PUBLICATIONS

International Search Report of the ISA dated Dec. 17, 2019 in connection with PCT/JP2019/036587.

*Primary Examiner* — Vip Patel
(74) *Attorney, Agent, or Firm* — K&L Gates LLP

(57) ABSTRACT

According to an aspect, an illumination device configured to be arranged opposing an image display surface of a reflective display device, includes: a translucent substrate; a plurality of light emitting elements that is provided to the translucent substrate; an anode electrode that is electrically coupled to the light emitting elements; and a cathode electrode that is electrically coupled to the light emitting elements. The anode electrode includes: a plurality of first partial anode electrodes having recessed structures in which the light emitting elements are arranged; and a second partial anode electrode that has a width less than widths of the first partial anode electrodes and couples the first partial anode electrodes.

17 Claims, 32 Drawing Sheets

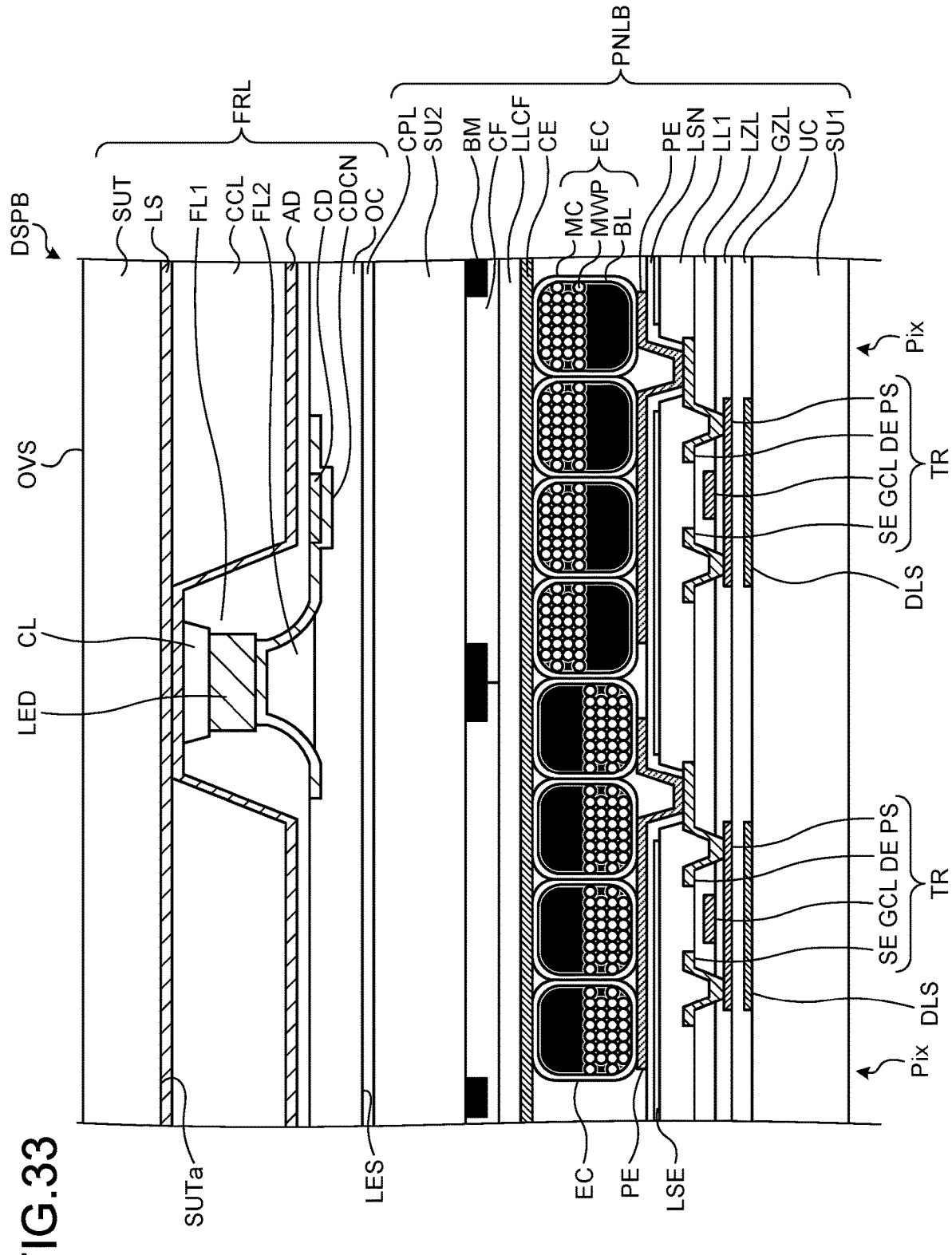

ILLUMINATION DEVICE AND DISPLAY DEVICE

CROSS-REFERENCE TO RELATED APPLICATION

This application claims the benefit of priority from Japanese Patent Application No. 2018-214927 filed on Nov. 15, 2018 and International Patent Application No. PCT/JP2019/036587 filed on Sep. 18, 2019, the entire contents of which are incorporated herein by reference.

BACKGROUND

1. Technical Field

What is disclosed herein relates to an illumination device and a display device.

2. Description of the Related Art

Reflective display devices configured to display an image by reflecting external light have been known. The reflective display device includes an illumination device arranged so as to oppose an image display surface (for example, see Japanese Patent Application Laid-open Publication No. 2013-110052 (JP-A-2013-110052)). Examples of light emitting elements that are used for the illumination device include organic electroluminescent elements and light emitting diodes (LED).

There is a desire to improve light extraction efficiency for illumination devices that use light emitting diodes. JP-A-2013-110052 describes that reflective layers are provided in order to increase light utilization efficiency. In JP-A-2013-110052, the reflective layers have flat plate shapes, and it can be difficult for the reflective layers to output light emitted from the side surfaces of the light emitting diodes to the image display surface side efficiently.

SUMMARY

According to an aspect, an illumination device configured to be arranged opposing an image display surface of a reflective display device, includes: a translucent substrate; a plurality of light emitting elements that is provided to the translucent substrate; an anode electrode that is electrically coupled to the light emitting elements; and a cathode electrode that is electrically coupled to the light emitting elements. The anode electrode includes: a plurality of first partial anode electrodes having recessed structures in which the light emitting elements are arranged; and a second partial anode electrode that has a width less than widths of the first partial anode electrodes and couples the first partial anode electrodes.

According to an aspect, a display device includes the above-mentioned illumination device and a display unit that displays an image with light emitted from the illumination device.

BRIEF DESCRIPTION OF THE DRAWINGS

FIG. 33 is a cross-sectional view schematically illustrating a display device according to an eighth embodiment.

DETAILED DESCRIPTION

Figure 1:
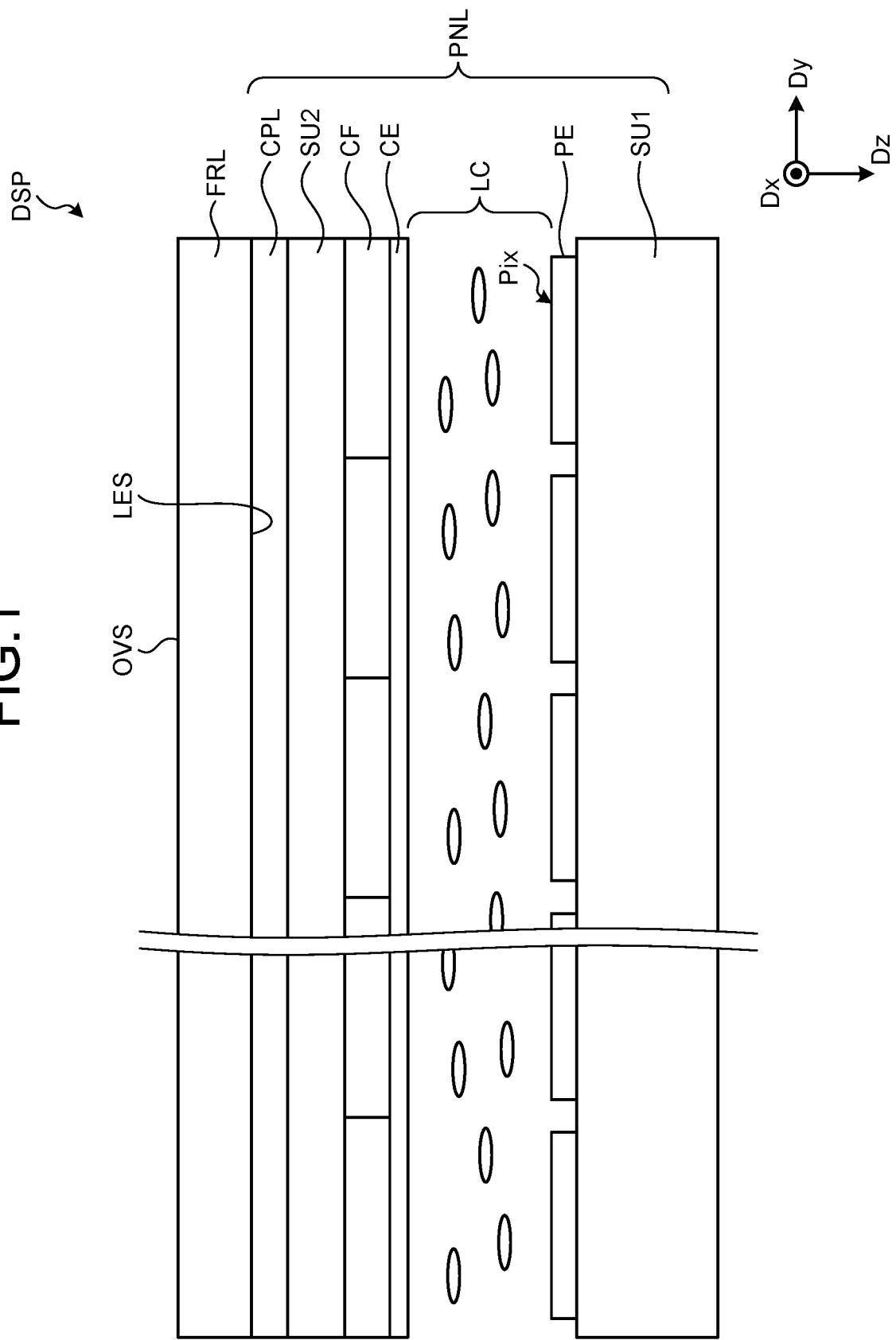
FIG. 1 is a cross-sectional view schematically illustrating a display device including an illumination device according to a first embodiment.

Modes for carrying out the present disclosure (embodiments) will be described in detail with reference to the drawings. Contents described in the following embodiments do not limit the present disclosure. Components described below include those that can be easily assumed by those skilled in the art and are substantially the same components. Furthermore, the components described below can be appropriately combined. What is disclosed herein is merely an example, and it is needless to say that appropriate modifications within the gist of the disclosure at which those skilled in the art can easily arrive are encompassed in the range of the present disclosure. In the drawings, widths, thicknesses, shapes, and the like of the components can be schematically illustrated in comparison with actual modes for more clear explanation. They are however merely examples and do not limit interpretation of the present disclosure. In the present specification and the drawings, the same reference numerals denote components similar to those described before with reference to the drawing that has been already referred, and detail explanation thereof can be appropriately omitted.

In this disclosure, when an element is described as being "on" another element, the element can be directly on the other element, or there can be one or more elements between the element and the other element. Also, when one thing is described as being "the same as" another, the one thing can be completely the same as the other or substantially the same as the other.

First Embodiment

FIG. 1 is a cross-sectional view schematically illustrating a display device including an illumination device according to a first embodiment. As illustrated in FIG. 1, a display device DSP includes a reflective display unit (display panel) PNL and an illumination device FRL. The illumination device FRL is arranged on the front surface (image display surface) side of the display unit PNL and is also called a front light. The illumination device FRL has a light emission surface LES and an observation surface OVS. The light emission surface LES is a surface through which light from light emitting elements LED is emitted and opposes a second substrate SU2 of the display device DSP. The observation surface OVS is an uppermost surface of the display device DSP and is a surface through which an image on the display unit PNL is observed.

The display unit PNL displays an image with light emitted from the illumination device FRL. Alternatively, the display unit PNL may display an image using external light. The display unit PNL includes a first substrate SU1, the second substrate SU2, and a liquid crystal layer LC. Pixel electrodes PE are provided to a surface of the first substrate SU1 that opposes the second substrate SU2. The pixel electrodes PE are provided for respective pixels Pix and are arranged on the first substrate SU1 in a two-dimensional matrix with a row-column configuration. Color filters CF and a common electrode CE are provided to a surface of the second substrate SU2 that opposes the first substrate SU1. A circular polarizing plate CPL is provided to a surface of the second substrate SU2 that opposes the illumination device FRL. The upper surface of the circular polarizing plate CPL corresponds to an image display surface of the display unit PNL.

The liquid crystal layer LC is provided between the first substrate SU1 and the second substrate SU2, that is, between the pixel electrodes PE and the common electrode CE. The pixel electrodes PE reflect external light or light from the illumination device FRL. The pixel electrodes PE may have a configuration in which transparent pixel electrodes and reflective films are combined and the reflective films reflect light. The pixel electrodes PE apply voltages corresponding to image signals to the liquid crystal layer LC in combination with the common electrode CE. A state of light passing through the liquid crystal layer LC is thereby changed, and an image is displayed on the observation surface OVS.

The configuration of the display unit PNL for liquid crystal driving is not particularly limited, and the display unit PNL may be configured to be driven in a longitudinal electric field mode such as a twisted nematic (TN) mode, a vertical alignment (VA) mode, and an electrically controlled birefringence (ECB) mode. Alternatively, the display unit PNL may be configured to be driven in a transverse electric field mode such as a fringe field switching (FFS) mode and an in-plane switching (IPS) mode.

Figure 2:
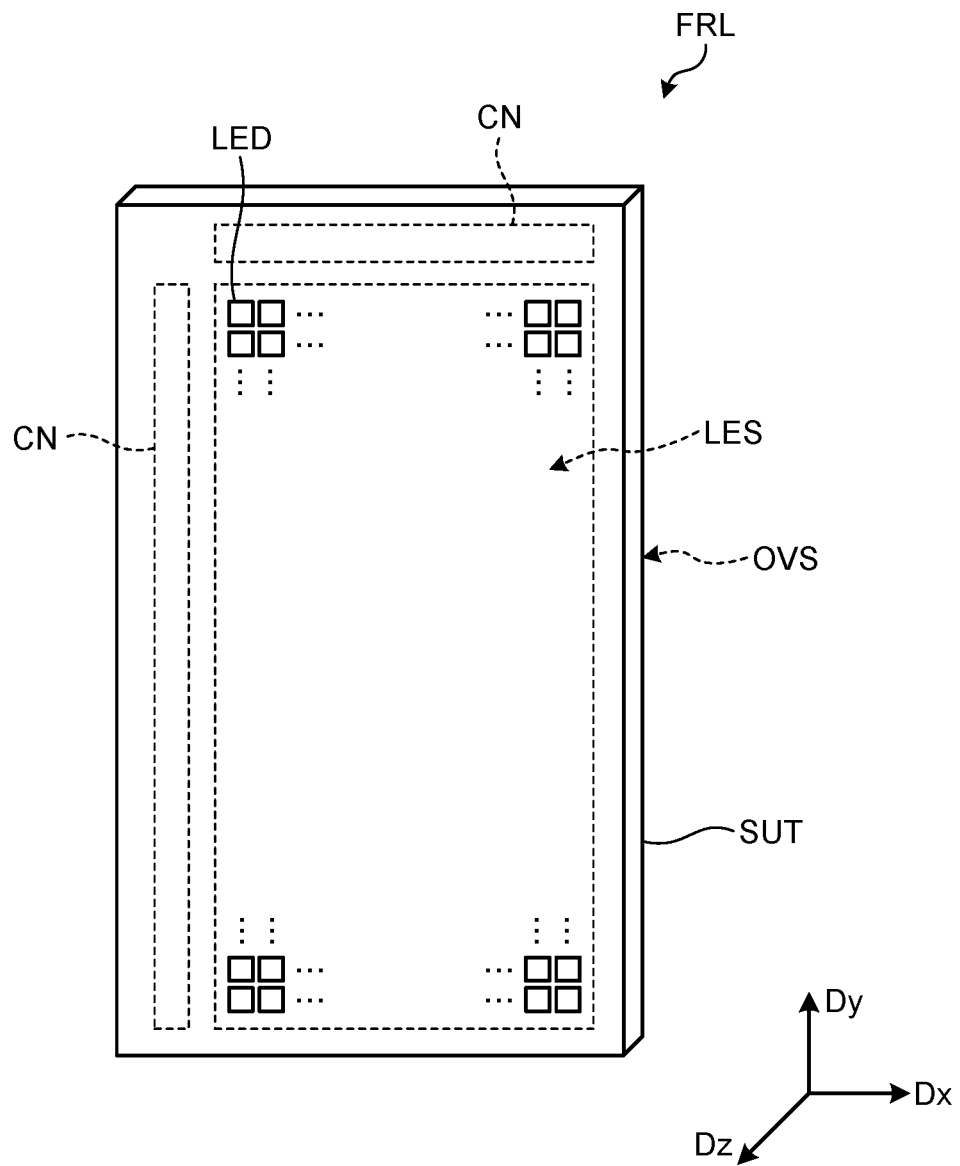
FIG. 2 is a perspective view of the illumination device in the first embodiment.

FIG. 2 is a perspective view of the illumination device in the first embodiment. As illustrated in FIG. 2, the illumination device FRL includes a translucent substrate SUT and the light emitting elements LED. The translucent substrate SUT is an insulating substrate and is formed of, for example, a glass substrate, a resin substrate, or a resin film. The translucent substrate SUT can be formed of borosilicate glass, for example. The light emitting elements LED are arranged on the light emission surface LES of the translucent substrate SUT. A plurality of wiring lines for supplying power to the light emitting elements LED are provided on the light emission surface LES. Coupling portions CN are provided at an upper side and a left side of the light emission surface LES. Drive circuits for driving the light emitting elements LED are coupled to the coupling portions CN.

Light from the light emitting elements LED is emitted toward the display unit PNL from the light emission surface LES. Light from the light emitting elements LED is not emitted from the observation surface OVS on the opposite side to the light emission surface LES. The illumination device FRL has preferable translucency when observed from any of the light emission surface LES and the observation surface OVS, and an image on the display unit PNL can be observed while passing through the illumination device FRL.

In the following description, a first direction Dx and a second direction Dy are parallel to one surface SUTa (see FIG. 6) of the translucent substrate SUT. The first direction Dx is orthogonal to the second direction Dy. The first direction Dx may not however be orthogonal to but may intersect with the second direction Dy. A third direction Dz is orthogonal to the first direction Dx and the second direction Dy. The third direction Dz corresponds to the normal direction of the translucent substrate SUT, for example. Hereinafter, plan view indicates a positional relation when seen from the third direction Dz.

Figure 3:
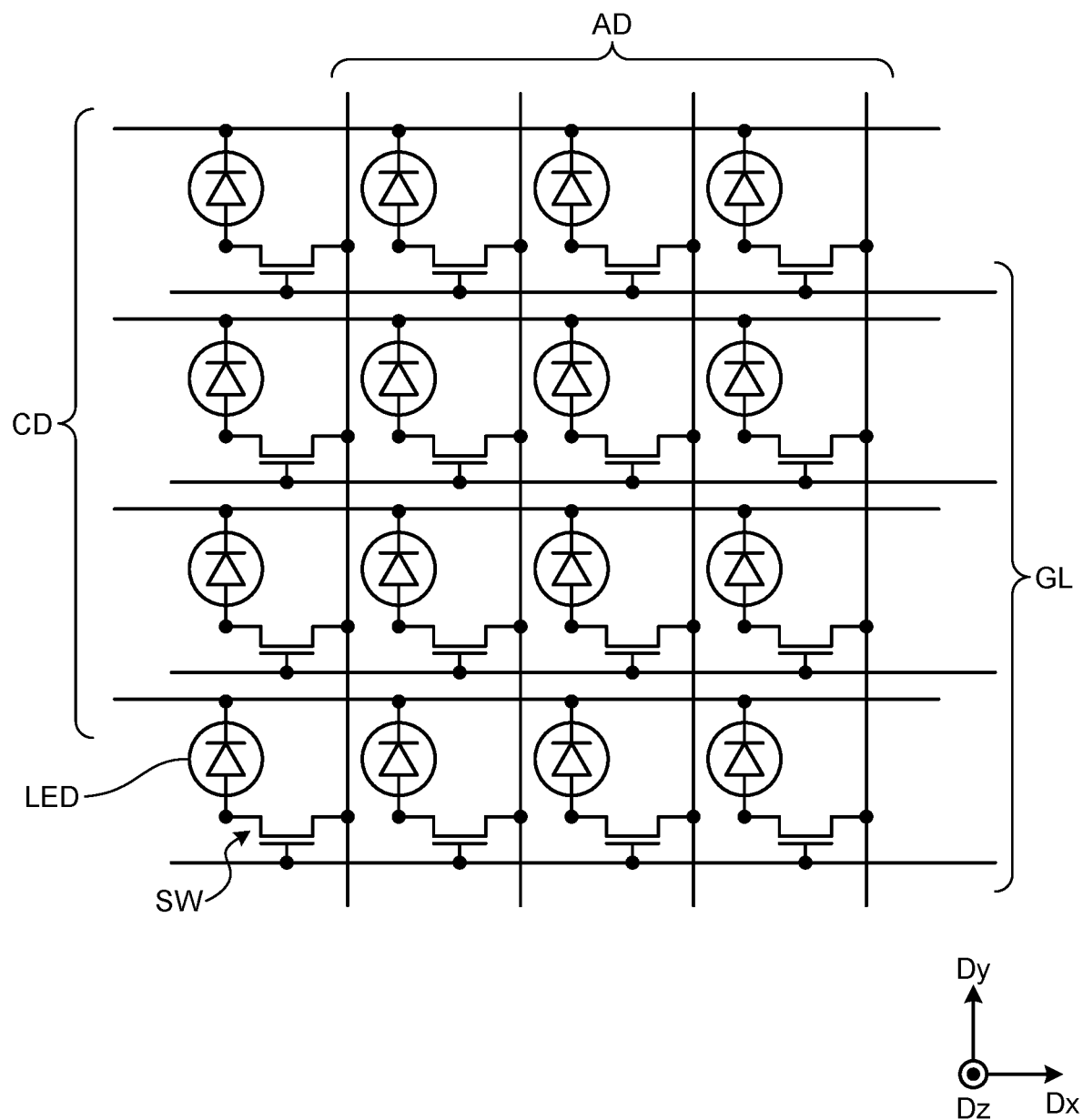
FIG. 3 is a circuit diagram illustrating an equivalent circuit of the illumination device in the first embodiment.

FIG. 3 is a circuit diagram illustrating an equivalent circuit of the illumination device in the first embodiment. As illustrated in FIG. 3, the illumination device FRL includes anode electrodes AD, cathode electrodes CD, scan lines GL, and switching elements SW. The anode electrodes AD and the cathode electrodes CD intersect with each other. The light emitting elements LED are provided in the vicinities of intersections of the anode electrodes AD and the cathode electrodes CD.

Cathodes (cathode terminals ELED2 (see FIG. 7)) of the light emitting elements LED are coupled to the cathode electrodes CD. Anodes (anode terminals ELED1 (see FIG. 7)) of the light emitting elements LED are coupled to the anode electrodes AD through the switching elements SW. The switching elements SW each include an n-type thin film transistor (TFTs). The scan lines GL are coupled to the gates of the switching elements SW.

Scan signals are supplied to the scan lines GL. The switching elements SW operate based on the scan signals, and the light emitting elements LED are coupled to the anode electrodes AD. An anode power supply potential is supplied to the anode electrodes AD. A cathode power supply potential is supplied to the cathode electrodes CD. The anode power supply potential is higher than the cathode power supply potential. The light emitting elements LED receive supply of forward current (drive current) with potential difference between the anode power supply potential and the cathode power supply potential and emit light.

The configuration in FIG. 3 enables driving to cause the light emitting elements LED to sequentially light while performing scanning at a high frequency equal to or higher than 60 Hz, for example. Even such driving can achieve substantially uniform light emission with an afterimage effect of human eyes. Only necessary portions on the image display surface of the display unit PNL can also be locally lightened, so that local dimming can be performed to improve contrast. The configuration can be simplified by omitting the switching elements SW illustrated in FIG. 3 when the image display surface is exclusively uniformly illuminated.

Figure 4:
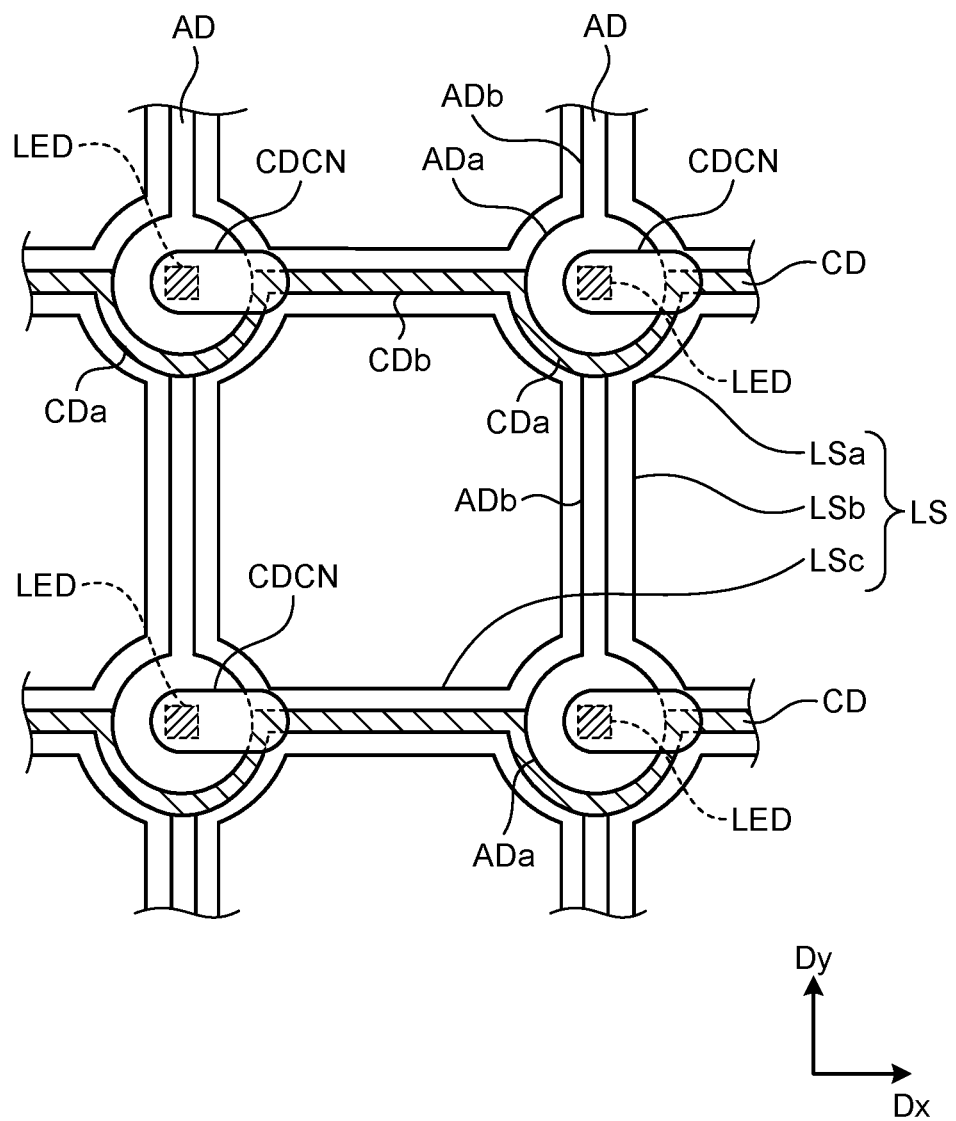
FIG. 4 is a plan view of the illumination device in the first embodiment.
Figure 5:
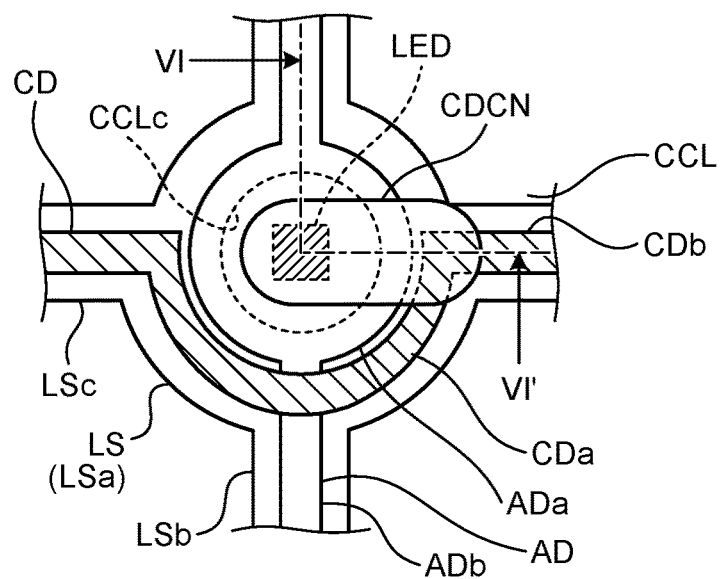
FIG. 5 is a plan view illustrating a light emitting element, an anode electrode, and a cathode electrode in FIG. 4 in an enlarged manner.

Next, the detail configurations of the light emitting elements LED, the anode electrodes AD, the cathode electrodes CD, and a light shielding layer LS will be described with reference to FIG. 4 to FIG. 7. FIG. 4 is a plan view of the illumination device in the first embodiment. FIG. 5 is a plan view illustrating the light emitting element, the anode electrode, and the cathode electrode in FIG. 4 in an enlarged manner.

As illustrated in FIG. 4, the light emitting elements LED are arranged in the first direction Dx and the second direction Dy in a matrix with a row-column configuration. The light emitting elements LED are inorganic light emitting diode (LED) chips having the size of about 3 μm to 100 μm in plan view and are called micro LEDs. In the embodiment, mini LEDs having the size of about 100 μm to 200 μm in plan view can also be applied.

The light emitting elements LED include red light emitting elements, green light emitting elements, and blue light emitting elements. The red light emitting element outputs red light. The green light emitting element outputs green light. The blue light emitting element outputs blue light. Maximum light emission wavelengths of the respective light emitting elements are 645 nm, 530 nm, and 450 nm. The arrangement of the red light emitting elements, the green light emitting elements, and the blue light emitting elements is not limited, and they may be arranged in a Bayer array or may be arranged such that the colors thereof are repeated. The light emitting elements LED may output different light in four or more colors.

The anode electrodes AD extend in the second direction Dy as a whole and are aligned in the first direction Dx. Each of the anode electrodes AD includes a plurality of first partial anode electrodes ADa and a plurality of second partial anode electrodes ADb. The first partial anode electrodes ADa are aligned in the second direction Dy. The second partial anode electrodes ADb extend in the second direction Dy and couple the first partial anode electrodes ADa adjacent in the second direction Dy.

The light emitting elements LED are arranged above the first partial anode electrodes ADa and are electrically coupled to the anode electrodes AD. The first partial anode electrodes ADa are provided so as to surround the light emitting elements LED in plan view. The width of the second partial anode electrodes ADb in the first direction Dx is less than the width of the first partial anode electrodes ADa in the first direction Dx. The first partial anode electrodes ADa have circular shapes. The first partial anode electrodes ADa are however not limited thereto and may have square shapes, polygonal shapes, irregular shapes having partially cutouts in the circular shapes, square shapes, or polygonal shapes, or the like.

The cathode electrodes CD extend in the first direction Dx as a whole and are aligned in the second direction Dy. Each of the cathode electrodes CD includes a plurality of first partial cathode electrodes CDa and a plurality of second partial cathode electrodes CDb. The first partial cathode electrodes CDa are aligned in the first direction Dx. The second partial cathode electrodes CDb extend in the first direction Dx and couple the first partial cathode electrodes CDa adjacent in the first direction Dx.

As illustrated in FIG. 5, the first partial cathode electrodes CDa are provided at positions not overlapping with the light emitting elements LED and are provided along the outer circumferences of the first partial anode electrodes ADa while being separated from the first partial anode electrodes ADa. The first partial cathode electrodes CDa intersect with the second partial anode electrodes ADb in plan view. The first partial cathode electrodes CDa are formed to have a constant width and may have the same width as that of the second partial cathode electrodes CDb, for example. The ends of the first partial cathode electrode CDa are coupled to the second partial cathode electrodes CDb that are adjacent to each other in the first direction Dx with the light emitting element LED and the first partial anode electrode ADa interposed therebetween.

The light emitting element LED and the cathode electrode CD are coupled to each other by a cathode coupling layer CDCN. The cathode coupling layer CDCN is made of a conductive material having translucency such as indium tin oxide (ITO). The first partial cathode electrode CDa has a semicircular curved shape but is not limited thereto. The first partial cathode electrode CDa may have a shape formed by connecting a plurality of linear portions.

A material of the anode electrodes AD and the cathode electrodes CD is a conductive metal material and is, for example, a three-layered multilayered film of titanium (Ti), aluminum (Al), and titanium (Ti). Alternatively, the material of the anode electrodes AD and the cathode electrodes CD can be a three-layered multilayered film of molybdenum (Mo), aluminum (Al), and molybdenum (Mo), a three-layered multilayered film of molybdenum-tungsten (MoW) alloy, aluminum (Al), and molybdenum-tungsten (MoW) alloy, or copper (Cu).

As illustrated in FIG. 4 and FIG. 5, the light shielding layer LS is provided in regions overlapping with the anode electrodes AD and the cathode electrodes CD in a lattice form in plan view. The light shielding layer LS is made of an organic film containing a black pigment as a material. The light transmissivity of the light shielding layer LS is lower than the light transmissivity of the translucent substrate SUT.

The light shielding layer LS includes first partial light shielding layers LSa, second partial light shielding layers LSb, and third partial light shielding layers LSc. Each of the first partial light shielding layers LSa is provided in a region overlapping with the light emitting element LED, the first partial anode electrode ADa, and the first partial cathode electrode CDa. Each of the second partial light shielding layers LSb overlaps with the second partial anode electrode ADb and extends in the second direction Dy. The width of the second partial light shielding layer LSb in the first direction Dx is less than the width of the first partial light shielding layer LSa in the first direction Dx. Each of the third partial light shielding layers LSc overlaps with the second partial cathode electrode CDb and extends in the first direction Dx. The width of the third partial light shielding layer LSc in the second direction Dy is less than the width of the first partial light shielding layer LSa in the second direction Dy.

The width of each second partial anode electrode ADb in the first direction Dx is, for example, about 5 μm. The width of each first partial anode electrode ADa in the first direction Dx is, for example, 30 μm. The widths of each first partial cathode electrode CDa and each second partial cathode electrode CDb in the second direction Dy are, for example, about 5 μm. The light shielding layer LS is provided so as to cover them, and the widths of each second partial light shielding layer LSb and each third partial light shielding layer LSc are, for example, about 15 μm. An interval between the anode electrodes AD in the first direction Dx, to be specific, an interval between the second partial anode electrodes ADb in the first direction Dx is, for example, about 200 μm. An interval between the cathode electrodes CD in the second direction Dy, to be specific, an interval between the second partial cathode electrodes CDb in the second direction Dy is, for example, about 200 μm.

With the above-mentioned configuration, the illumination device FRL has an area proportion of the regions having translucency in the light emission surface LES, that is, an area proportion of the regions that are not covered by wiring lines such as the anode electrodes AD, the cathode electrodes CD, and the light shielding layer LS is equal to or greater than 80%. Thus, the illumination device FRL is a bright planar light source that is excellent in translucency.

Figure 6:
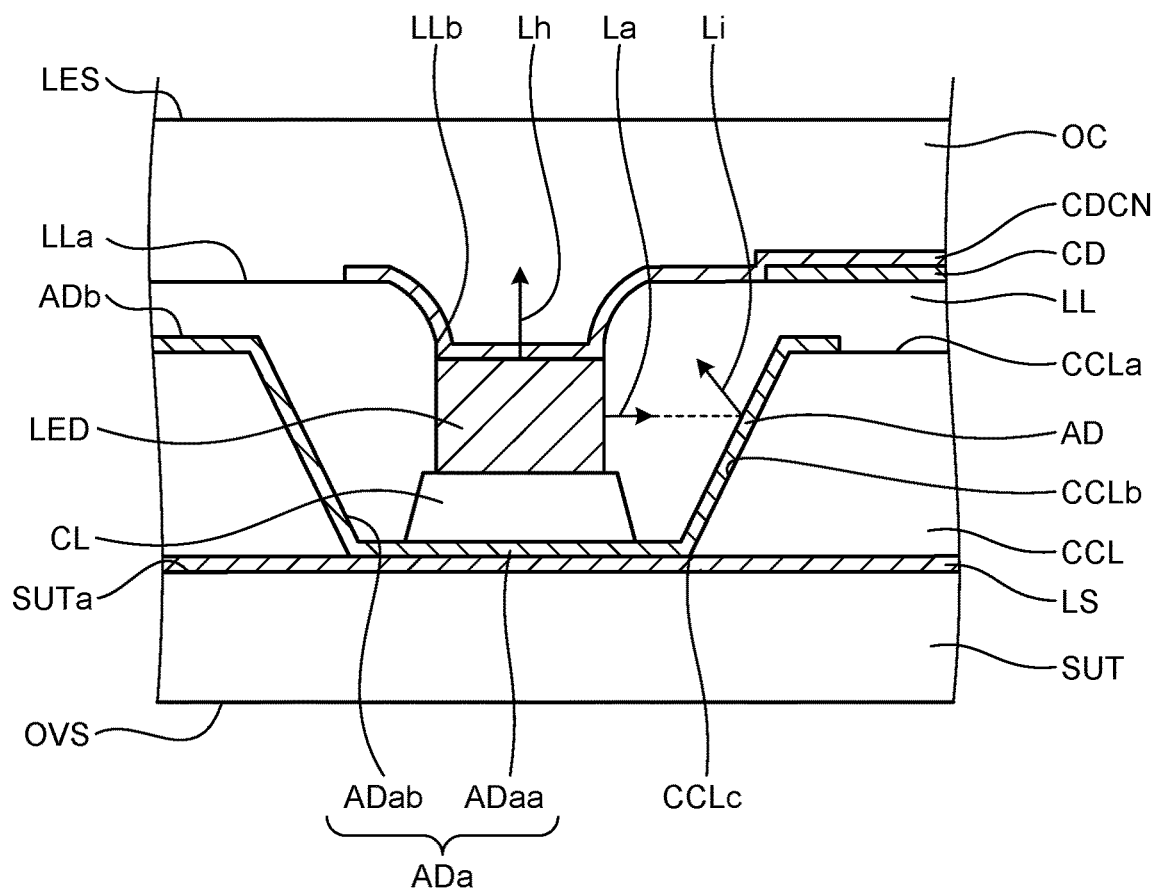
FIG. 6 is a cross-sectional view taken along line VI-VI' in FIG. 5.

FIG. 6 is a cross-sectional view taken along line VI-VI' in FIG. 5. FIG. 6 illustrates the illumination device FRL illustrated in FIG. 1 in an inverted manner in the up-down direction. That is to say, the light emission surface LES is illustrated on the upper side in FIG. 6. As illustrated in FIG. 6, the light shielding layer LS, a resin layer CCL, the anode electrode AD, a coupling layer CL, the light emitting element LED, a flattening layer LL, the cathode electrode CD and the cathode coupling layer CDCN, and an overcoat layer OC are stacked on the one surface SUTa of the translucent substrate SUT in the order as listed. In the example illustrated in FIG. 6, the surface of the overcoat layer OC is the light emission surface LES, and the surface of the translucent substrate SUT on the opposite side to the one surface SUTa is the observation surface OVS.

The light shielding layer LS is provided between the translucent substrate SUT and the anode electrodes AD and between the translucent substrate SUT and the cathode electrodes CD. The first partial light shielding layers LSa, the second partial light shielding layers LSb, and the third partial light shielding layers LSc of the light shielding layer LS are provided in the same layer on the one surface SUTa of the translucent substrate SUT.

The resin layer CCL is provided on the light shielding layer LS and above the translucent substrate SUT. The resin layer CCL has openings CCLc, and the light emitting elements LED are provided at bottom portions of the openings CCLc, respectively. To be more specific, the resin layer CCL has an upper surface CCLa and wall surfaces CCLb. The wall surfaces CCLb are provided so as to surround the side surfaces of the light emitting elements LED and are inclined with respect to the one surface SUTa.

Each anode electrode AD is provided in a recessed structure formed by the resin layer CCL and the light shielding layer LS. Each of the first partial anode electrodes ADa is provided along the wall surface CCLb and the light shielding layer LS and has a cross-sectional shape of a recessed structure. In the first partial anode electrode ADa, a portion provided along the wall surface CCLb is referred to as an anode-electrode inclined portion ADab, and a portion provided in contact with the light shielding layer LS is referred to as an anode-electrode bottom portion ADaa. The anode-electrode bottom portion ADaa is provided in parallel with the one surface SUTa, and the anode-electrode inclined portion ADab is inclined with respect to the anode-electrode bottom portion ADaa. Each of the second partial anode electrodes ADb is provided on the upper surface CCLa.

The light emitting element LED is provided in the recessed structure of the first partial anode electrode ADa. To be specific, the light emitting element LED is coupled onto the anode-electrode bottom portion ADaa through the coupling layer CL. The anode-electrode inclined portion ADab opposes the side surfaces of the coupling layer CL and the light emitting element LED.

The flattening layer LL covers at least the side surfaces of the light emitting elements LED and is provided on the upper sides of the anode electrodes AD. The flattening layer LL flattens the recessed structures of the first partial anode electrodes ADa and insulates the anode electrodes AD and the cathode electrodes CD from each other.

The flattening layer LL has openings LLb, and the upper surfaces of the light emitting elements LED are respectively located at bottom portions of the openings LLb. Each of the cathode electrodes CD is provided on an upper surface LLa of the flattening layer LL. The cathode coupling layer CDCN is provided on the upper surface LLa and in the opening LLb and couples the cathode electrode CD and the light emitting element LED.

The overcoat layer OC covers the cathode electrodes CD and the cathode coupling layers CDCN and is provided on or above the flattening layer LL. All of the resin layer CCL, the flattening layer LL, and the overcoat layer OC are organic films having translucency and can be formed of, for example, negative resists.

Figure 7:
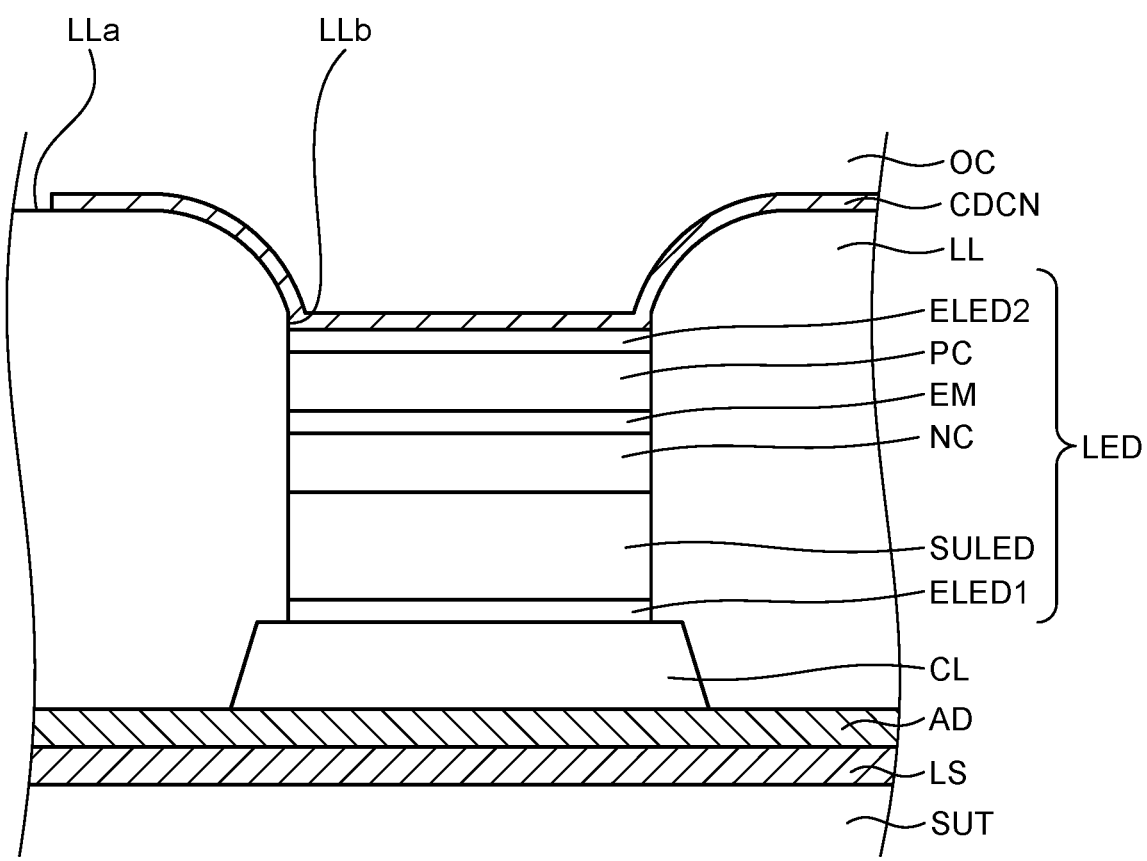
FIG. 7 is a cross-sectional view illustrating the light emitting element in FIG. 6 in an enlarged manner.

Next, the configuration of the light emitting elements LED is described. FIG. 7 is a cross-sectional view illustrating the light emitting element in FIG. 6 in an enlarged manner. As illustrated in FIG. 7, the light emitting element LED includes a light emitting element substrate SULED, an n-type clad layer NC, a light emitting layer EM, a p-type clad layer PC, the anode terminal ELED1, and the cathode terminal ELED2. The n-type clad layer NC, the light emitting layer EM, the p-type clad layer PC, and the cathode terminal ELED2 are stacked on the light emitting element substrate SULED in the order as listed. The anode terminal ELED1 is provided between the light emitting element substrate SULED and the coupling layer CL.

In the blue light emitting element outputting blue light, the light emitting layer EM is made of indium gallium nitride (InGaN), and a composition ratio of indium and gallium thereof is, for example, 0.2:0.8. The p-type clad layer PC and the n-type clad layer NC are made of gallium nitride (GaN). The light emitting element substrate SULED is made of silicon carbide (SiC).

In the green light emitting element outputting green light, the light emitting layer EM is made of indium gallium nitride (InGaN), and a composition ratio of indium and gallium thereof is, for example, 0.45:0.55. The p-type clad layer PC and the n-type clad layer NC are made of gallium nitride (GaN). The light emitting element substrate SULED is made of silicon carbide (SiC).

In the red light emitting element outputting red light, the light emitting layer EM is made of aluminum gallium indium (AlGaIn), and a composition ratio of aluminum, gallium, and indium thereof is, for example, 0.225:0.275:0.5. The p-type clad layer PC and the n-type clad layer NC are made of aluminum indium phosphide (AlInP). The light emitting element substrate SULED is made of gallium arsenide (GaAs).

All of the anode terminals ELED1 and the cathode terminals ELED2 of the red light emitting element, the green light emitting element, and the blue light emitting element are made of aluminum.

In a manufacturing process of each light emitting element LED, a manufacturing device forms films of the n-type clad layer NC, the light emitting layer EM, the p-type clad layer PC, and the cathode terminal ELED2 on the light emitting element substrate SULED. Thereafter, the manufacturing device fabricates the light emitting element substrate SULED into a thin film and forms the anode terminal ELED1 on the bottom surface of the light emitting element SULED. The manufacturing device then arranges the light emitting element LED, which has been subjected to cutting processing into a square shape, on the coupling layer CL.

A silver paste is used for the coupling layer CL; whereby, in arranging the light emitting element LED on the coupling layer CL, the coupling layer CL is deformed with pressure and brought into intimate contact with the light emitting element LED for conduction therewith. Alternatively, the same metal material as that of the anode terminal ELED1, for example, aluminum may be used for the coupling layer CL. In this case, the anode terminal ELED1 and the coupling layer CL are integrated with each other by performing heating processing after the light emitting element LED is arranged on the coupling layer CL. The coupling layer CL is thereby made well-conductive with the light emitting element LED.

As illustrated in FIG. 6, light output from the light emitting element LED includes not only light Lh that is output upward but also light La that is output from the side surface thereof. The light Lh passes through the cathode coupling layer CDCN and the overcoat layer OC and is output to the display unit PNL. The light emitting element LED is arranged in the recessed structure of the anode electrode AD in the embodiment. The light La is therefore incident on the anode-electrode inclined portion ADab and is reflected by the anode-electrode inclined portion ADab. The anode-electrode inclined portion ADab is inclined, so that the traveling direction of reflected light Li is directed upward and is output to the display unit PNL side. Light traveling obliquely downward from the light emitting element LED is reflected by the anode-electrode bottom portion ADaa and is output to the display unit PNL side. With this mechanism, the light La that is output from the side surface (surfaces) of the light emitting element LED can also be output to the display unit PNL side. This can improve light extraction efficiency of the illumination device FRL.

Usage of the micro LEDs for the light emitting elements LED enables sufficiently bright light to be emitted to the display unit PNL while keeping the translucency of the entire illumination device FRL. Light leakage from the illumination device FRL can be reduced and a preferable contrast ratio can be provided in comparison with an illumination device that emits light from a light source while expanding the light in a planar form by using a light guiding plate.

The light shielding layer LS is provided, thereby hampering external light from being incident on the anode electrodes AD and the cathode electrodes CD from the observation surface OVS. The anode electrodes AD and the cathode electrodes CD can be hampered from being viewed from the observation surface OVS.

First Modification of First Embodiment

Figure 8:
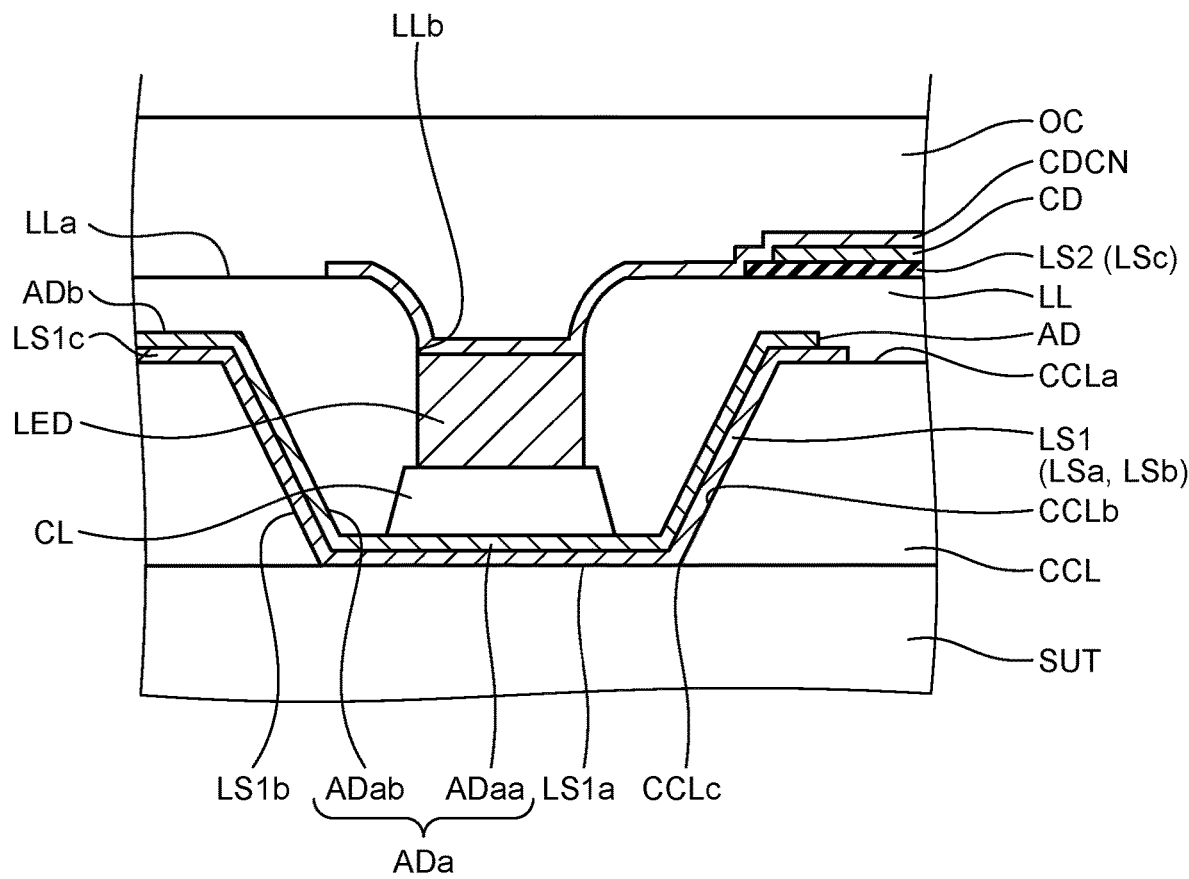
FIG. 8 is a cross-sectional view illustrating an illumination device according to a first modification of the first embodiment.

FIG. 8 is a cross-sectional view illustrating an illumination device according to a first modification of the first embodiment. In the following description, the same reference numerals denote the components described in the above-mentioned embodiment, and duplicated explanations thereof are omitted. As illustrated in FIG. 8, the illumination device FRL includes first light shielding layers LS1 and second light shielding layers LS2 in the first modification. The first light shielding layers LS1 are provided in regions overlapping with the anode electrodes AD and between the translucent substrate SUT and the anode electrodes AD. To be specific, the first light shielding layers LS1 are provided in recessed structures formed by the translucent substrate SUT and the resin layer CCL.

The first light shielding layers LS1 include first light shielding layer bottom portions LS1a, first light shielding layer inclined portions LS1b, and first light shielding layer connecting portions LS1c. The first light shielding layer bottom portions LS1a are provided between the translucent substrate SUT and the anode-electrode bottom portions ADaa. The first light shielding layer inclined portions LS1b are coupled to the first light shielding layer bottom portions LS1a and provided along the wall surfaces CCLb. The first light shielding layer inclined portions LS1b are provided between the anode-electrode inclined portions ADab and the wall surfaces CCLb. The first light shielding layer connecting portions LS1c are provided between the upper surface CCLa of the resin layer CCL and the second partial anode electrodes ADb. The first light shielding layers LS1 each have shapes similar to those of the first partial light shielding layer LSa and the second partial light shielding layer LSb illustrated in FIG. 4 in plan view.

The second light shielding layers LS2 are provided on the upper surface LLa of the flattening layer LL and provided between the flattening layer LL and the cathode electrodes CD. The second light shielding layers LS2 are provided in regions overlapping with the cathode electrodes CD in plan view, and to be specific, are provided in regions overlapping with the third partial light shielding layers LSc and the second partial cathode electrodes CDb illustrated in FIG. 4. The second light shielding layers LS2 may partially overlap with the first light shielding layers LS1.

In the first modification, the first light shielding layers LS1 are in contact with the anode electrodes AD, and the second light shielding layers LS2 are in contact with the cathode electrodes CD. That is to say, a distance between the first light shielding layers LS1 and the anode electrodes AD and a distance between the second light shielding layers LS2 and the cathode electrodes CD are shorter than those in the first embodiment. The first light shielding layers LS1 and the second light shielding layers LS2 can therefore reduce external light incident on the anode electrodes AD and the cathode electrodes CD.

Second Modification of First Embodiment

Figure 9:
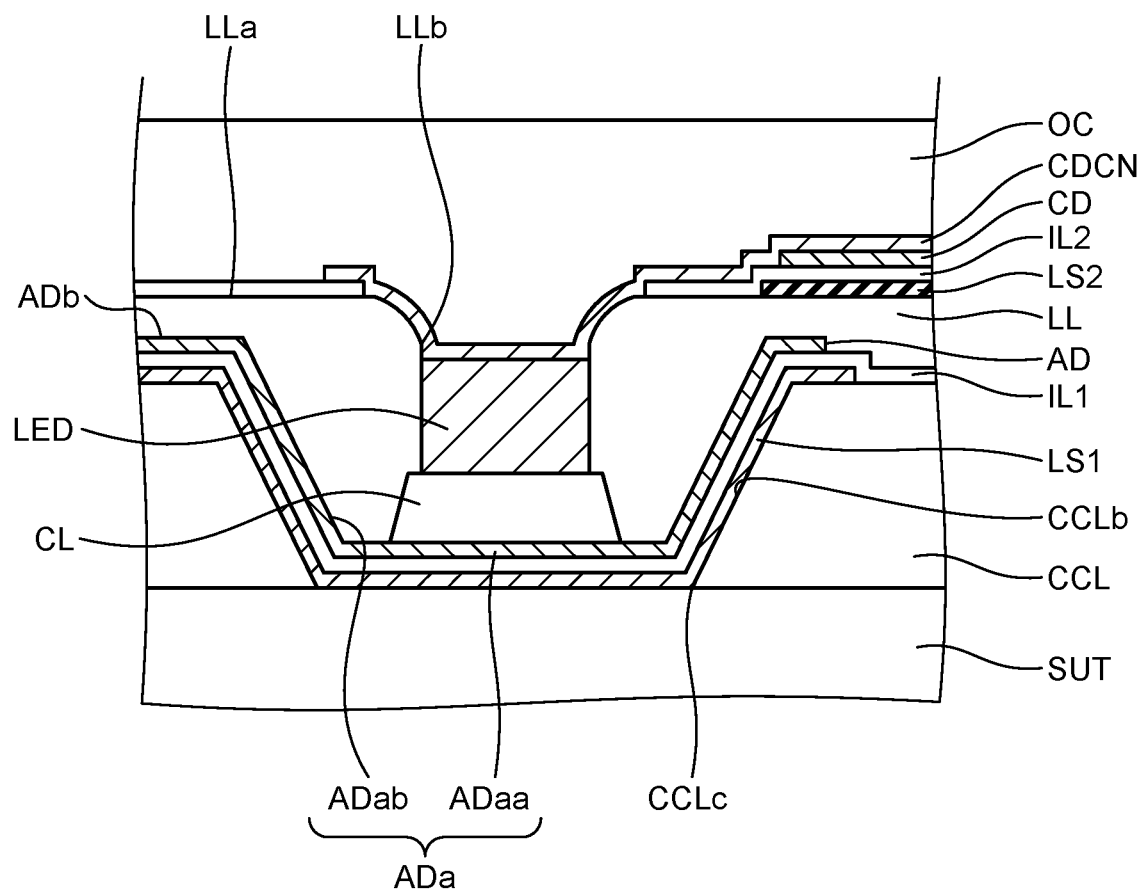
FIG. 9 is a cross-sectional view illustrating an illumination device according to a second modification of the first embodiment.

FIG. 9 is a cross-sectional view illustrating an illumination device according to a second modification of the first embodiment. As illustrated in FIG. 9, the illumination device FRL includes a first insulating layer IL1 and a second insulating layer IL2 in the second modification. The first insulating layer IL1 is provided between the first light shielding layers LS1 and the anode electrodes AD in the normal direction of the translucent substrate SUT. The first insulating layer IL1 is provided over the entire surface of the light emission surface LES across the light emitting elements LED. The first insulating layer IL1 is provided along the upper surface CCLa and the wall surfaces CCLb of the resin layer CCL and is provided also in regions overlapping with bottom portions of the openings CCLc thereof.

The second insulating layer IL2 is provided between the second light shielding layers LS2 and the cathode electrodes CD in the normal direction of the translucent substrate SUT. End portions of the second insulating layer IL2 are arranged between the flattening layer LL and the cathode coupling layers CDCN. The second insulating layer IL2 is provided over the entire surface of the flattening layer LL across the light emitting elements LED but not provided in regions overlapping with the openings LLb.

A silicon oxide (SiO$_2$) layer and a silicon nitride (SiN) layer can be applied as materials of the first insulating layer IL1 and the second insulating layer IL2. Alternatively, an organic film having translucency may be used as the materials of the first insulating layer IL1 and the second insulating layer IL2.

The first insulating layer IL1 insulates the first light shielding layers LS1 from the anode electrodes AD, and the second insulating layer IL2 insulates the second light shielding layers LS2 from the cathode electrodes CD. Thus, influences of an electric field by the first light shielding layers LS1 and the second light shielding layers LS2 can be reduced, whereby deterioration of the anode electrodes AD and the cathode electrodes CD in the illumination device FRL can be reduced.

Third Modification of First Embodiment

Figure 10:
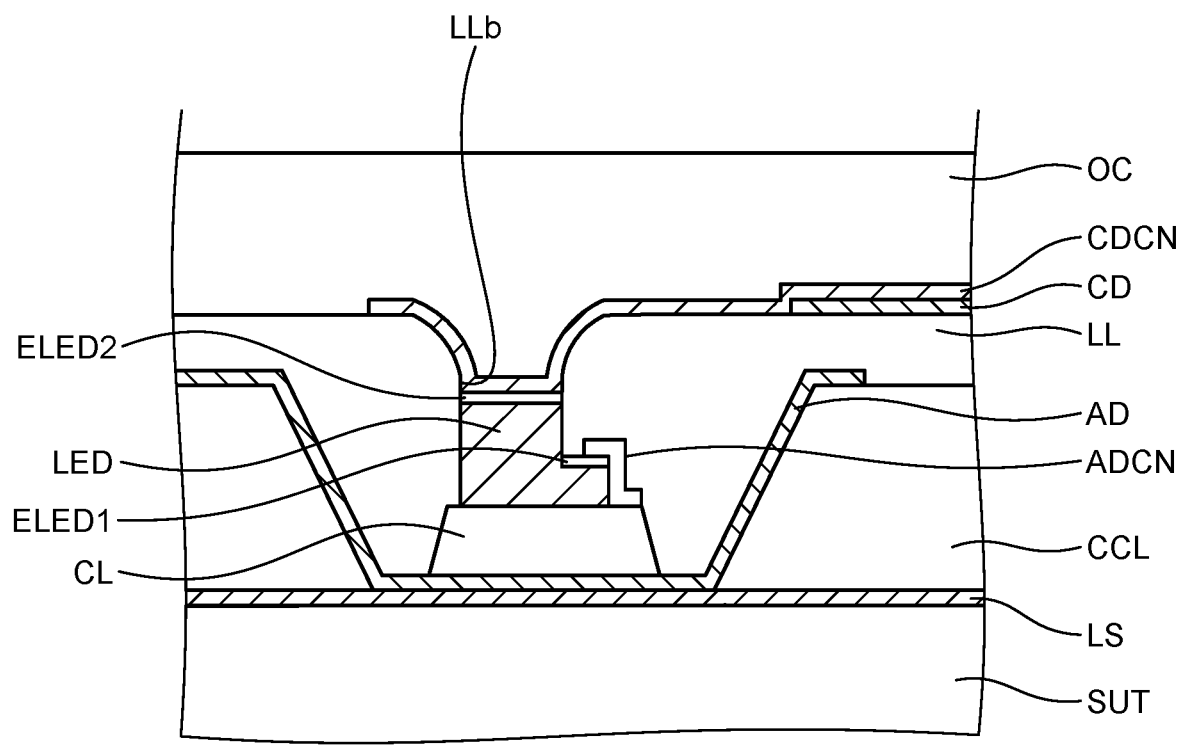
FIG. 10 is a cross-sectional view illustrating an illumination device according to a third modification of the first embodiment.

FIG. 10 is a cross-sectional view illustrating an illumination device according to a third modification of the first embodiment. Each light emitting element LED in the first embodiment, the first modification, and the second modification has a vertical structure in which a lower portion of the light emitting element LED is coupled to the anode electrode AD and an upper portion of the light emitting element LED is coupled to the cathode electrode CD. However, the light emitting element LED is not limited thereto. As illustrated in FIG. 10, both of the anode terminal ELED1 and the cathode terminal ELED2 are provided on the upper surface side of the light emitting element LED in the third modification.

The cathode terminal ELED2 is electrically coupled to the cathode coupling layer CDCN in the opening LLb. The anode terminal ELED1 is electrically coupled to the coupling layer CL through an anode coupling layer ADCN. The anode coupling layer ADCN can be made of molybdenum-tungsten alloy. Alternatively, the anode coupling layer ADCN can be made of a multilayered film of molybdenum-tungsten alloy and aluminum.

As described above, the illumination device FRL can employ the light emitting elements LED each having a horizontal structure in which the anode terminal ELED1 and the cathode terminal ELED2 are arranged on the same surface side.

Second Embodiment

Figure 11:
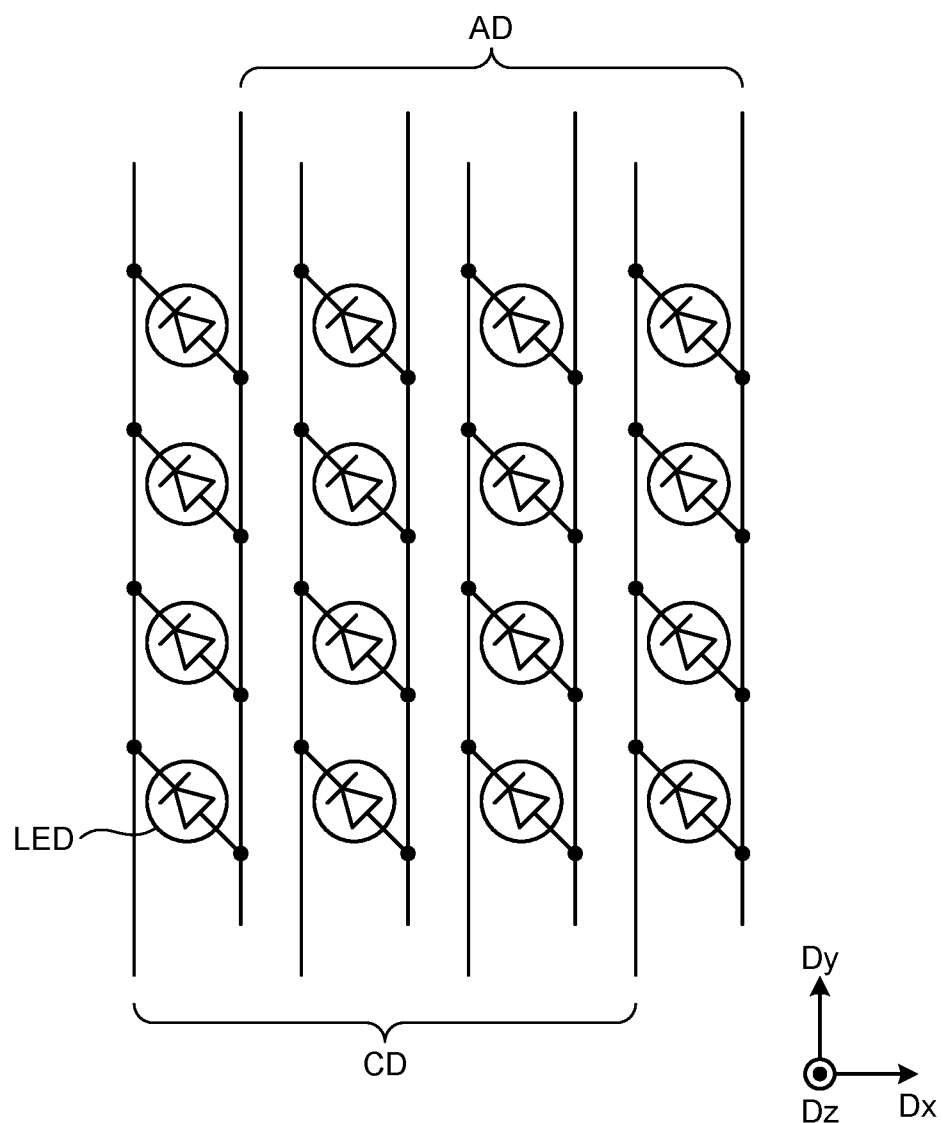
FIG. 11 is a circuit diagram illustrating an equivalent circuit of an illumination device according to a second embodiment.
Figure 12:
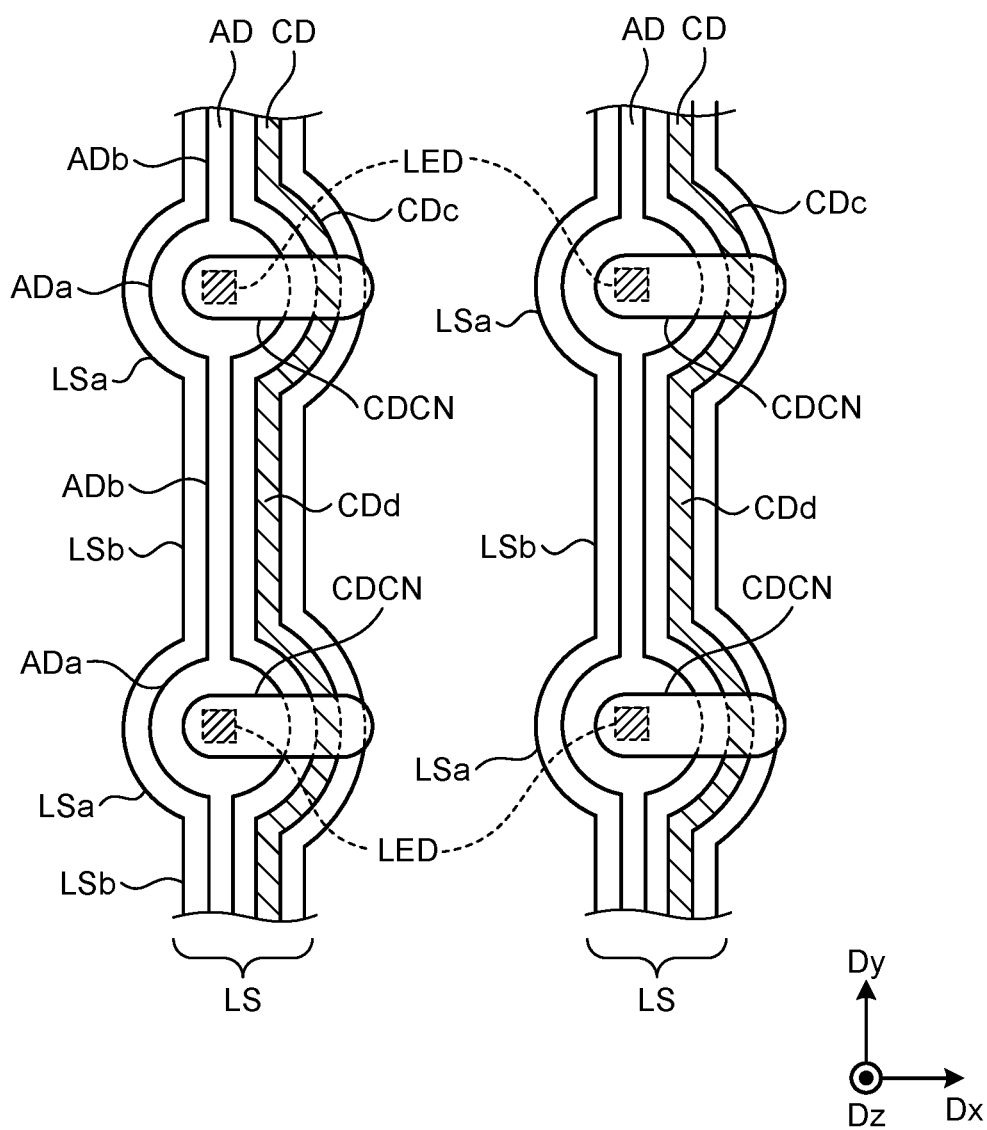
FIG. 12 is a plan view of the illumination device in the second embodiment.
Figure 13:
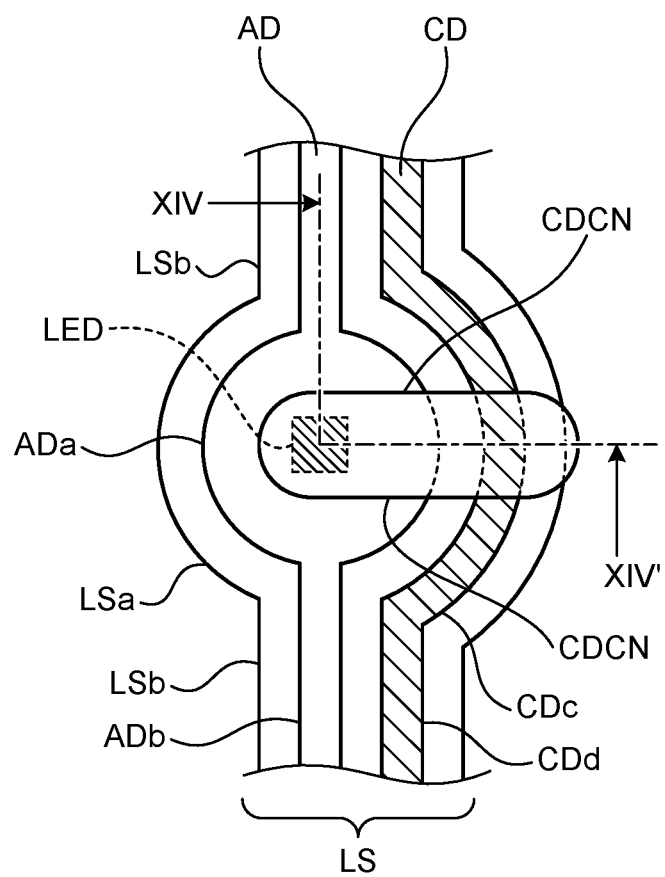
FIG. 13 is a plan view illustrating a light emitting element, an anode electrode, and a cathode electrode in FIG. 12 in an enlarged manner.
Figure 14:
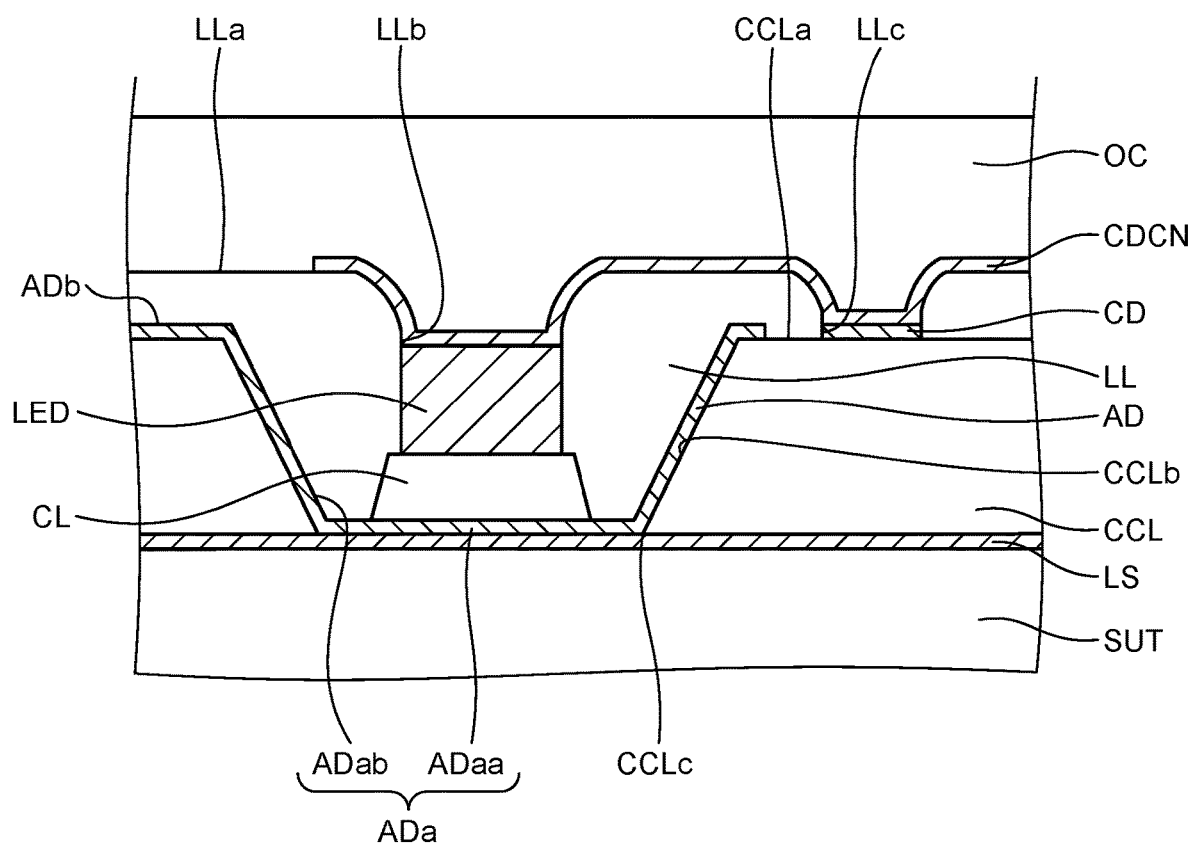
FIG. 14 is a cross-sectional view taken along line XIV-XIV' in FIG. 13.

FIG. 11 is a circuit diagram illustrating an equivalent circuit of an illumination device according to a second embodiment. FIG. 12 is a plan view of the illumination device in the second embodiment. FIG. 13 is a plan view illustrating a light emitting element, an anode electrode, and a cathode electrode in FIG. 12 in an enlarged manner. FIG. 14 is a cross-sectional view taken along line XIV-XIV' in FIG. 13.

As illustrated in FIG. 11, the cathode electrodes CD are arranged so as to be adjacent to the anode electrodes AD in the first direction Dx and extend in the second direction Dy so as to be parallel to the anode electrodes AD. The anode electrodes AD and the cathode electrodes CD are alternately arranged in the first direction Dx. The light emitting elements LED are arranged between the anode electrodes AD and the cathode electrodes CD aligned in the first direction Dx and are electrically coupled to the anode electrodes AD and the cathode electrodes CD.

Although FIG. 11 omits illustration of the scan lines GL and the switching elements SW (see FIG. 3) for making the drawing easy to view, the switching elements SW are provided for the respective light emitting elements LED, and the scan lines GL are provided so as to intersect with the anode electrodes AD and the cathode electrodes CD in the same manner as in FIG. 3.

As illustrated in FIG. 12 and FIG. 13, the configuration of the anode electrodes AD (the first partial anode electrodes ADa and the second partial anode electrodes ADb) is the same as that in the first embodiment. The cathode electrodes CD extend in the second direction Dy as a whole. To be specific, first partial cathode electrodes CDc are adjacent to the first partial anode electrodes ADa in the first direction Dx, respectively. Each of the first partial cathode electrodes CDc is provided along the outer circumference of a corresponding one of the first partial anode electrodes ADa while being separated from the first partial anode electrode ADa. The first partial cathode electrode CDc is electrically coupled to the light emitting element LED by the cathode coupling layer CDCN.

Second partial cathode electrodes CDd are separated from the second partial anode electrodes ADb in the first direction Dx and extend in the same second direction Dy in which the second partial anode electrodes ADb extend. The second partial cathode electrodes CDd couple the first partial cathode electrodes CDc aligned in the second direction Dy. An interval between the second partial cathode electrodes CDd and the second partial anode electrodes ADb in the first direction Dx is, for example, about 5 μm.

Light shielding layers LS each overlap with the anode electrode AD and the cathode electrode CD adjacent to each other in the first direction Dx and extends in the second direction Dy. To be specific, the first partial light shielding layer LSa overlaps with the first partial anode electrode ADa and the first partial cathode electrode CDc. The second partial light shielding layer LSb overlaps with the second partial anode electrode ADb and the second partial cathode electrode CDd. The width of the second partial light shielding layer LSb in the first direction Dx is less than the width of the first partial light shielding layer LSa in the first direction Dx. A set of the anode electrode AD and the cathode electrode CD overlapping with one light shielding layer LS is coupled to the light emitting elements LED aligned in the second direction Dy.

The cathode electrodes CD and the anode electrodes AD extend in the same direction (second direction Dy) and have no intersection in this embodiment. The cathode electrodes CD are therefore provided on the upper surface CCLa of the resin layer CCL in the same layer as the second partial anode electrodes ADb of the anode electrodes AD, as illustrated in FIG. 14.

The flattening layer LL covers the anode electrodes AD and the cathode electrodes CD and is provided on the upper surface CCLa of the resin layer CCL and in recessed structures formed by the resin layer CCL and the first partial anode electrodes ADa. The flattening layer LL has the openings LLb provided in portions overlapping with the light emitting elements LED and openings LLc in portions overlapping with the cathode electrodes CD. Each of the cathode coupling layers CDCN is provided on the upper side of the flattening layer LL, and one end thereof is coupled to the cathode electrode CD in the opening LLc and the other end thereof is coupled to the light emitting element LED in the opening LLb.

In the second embodiment, the width of each of the light shielding layers LS in the first direction Dx is greater than that in the first embodiment but the third partial light shielding layers LSc (see FIG. 4) need not to be provided. The illumination device FRL is thereby a bright planar light source that is excellent in translucency in the same manner as the first embodiment. Furthermore, in the second embodiment, the anode electrodes AD and the cathode electrodes CD can be formed in the same process, thereby simplifying the manufacturing process of the illumination device FRL.

The above-mentioned configurations in the first modification to the third modification can be also applied to the second embodiment. For example, the light shielding layers LS may be provided so as to be in contact with the anode electrodes AD and the cathode electrodes CD, or the light shielding layers LS and the anode electrodes AD and the cathode electrodes CD may be stacked with the first insulating layer IL1 and the second insulating layer IL2 therebetween. In this case, the light shielding layers LS are provided along the upper surface CCLa of the resin layer CCL, the wall surfaces CCLb thereof, and the translucent substrate SUT at the bottom portions of the openings CCLc.

Third Embodiment

Figure 15:
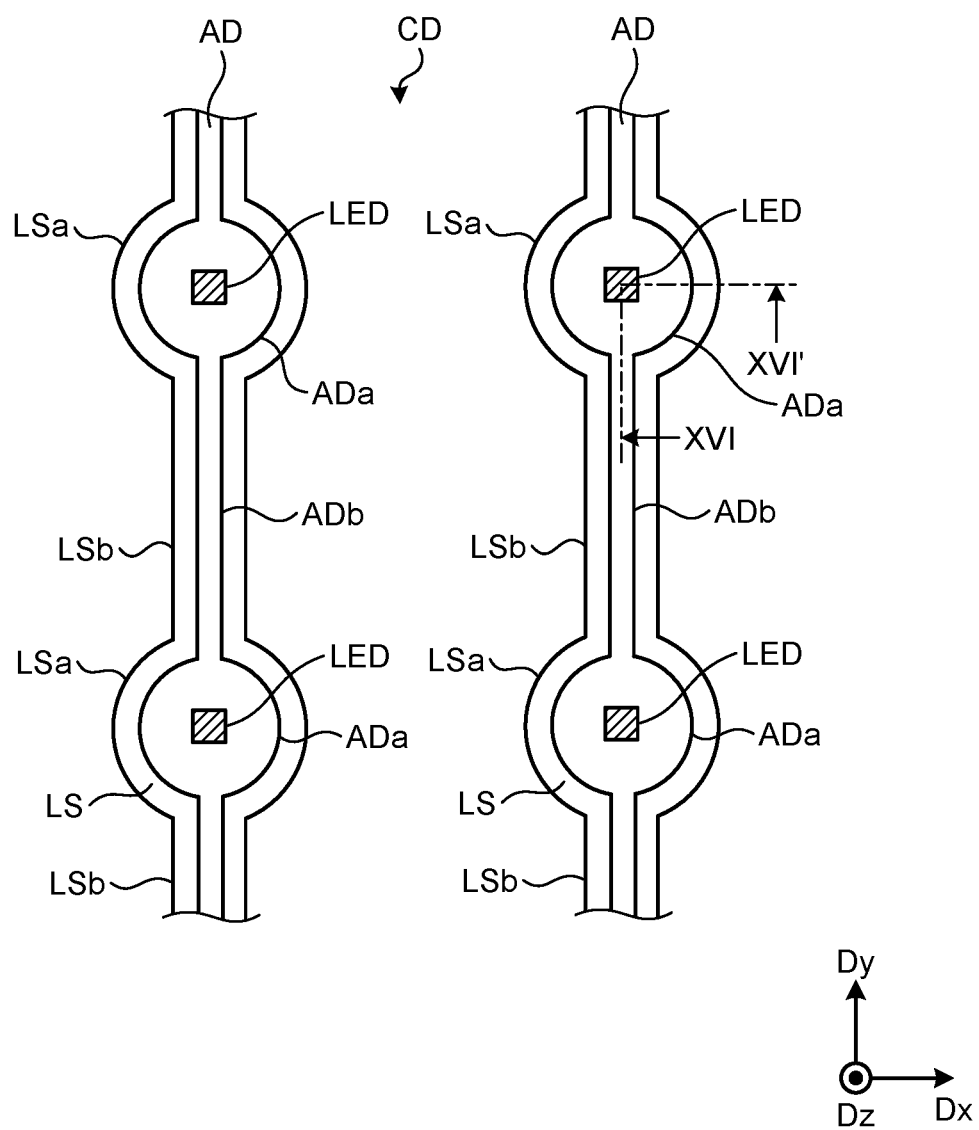
FIG. 15 is a plan view of an illumination device according to a third embodiment.
Figure 16:
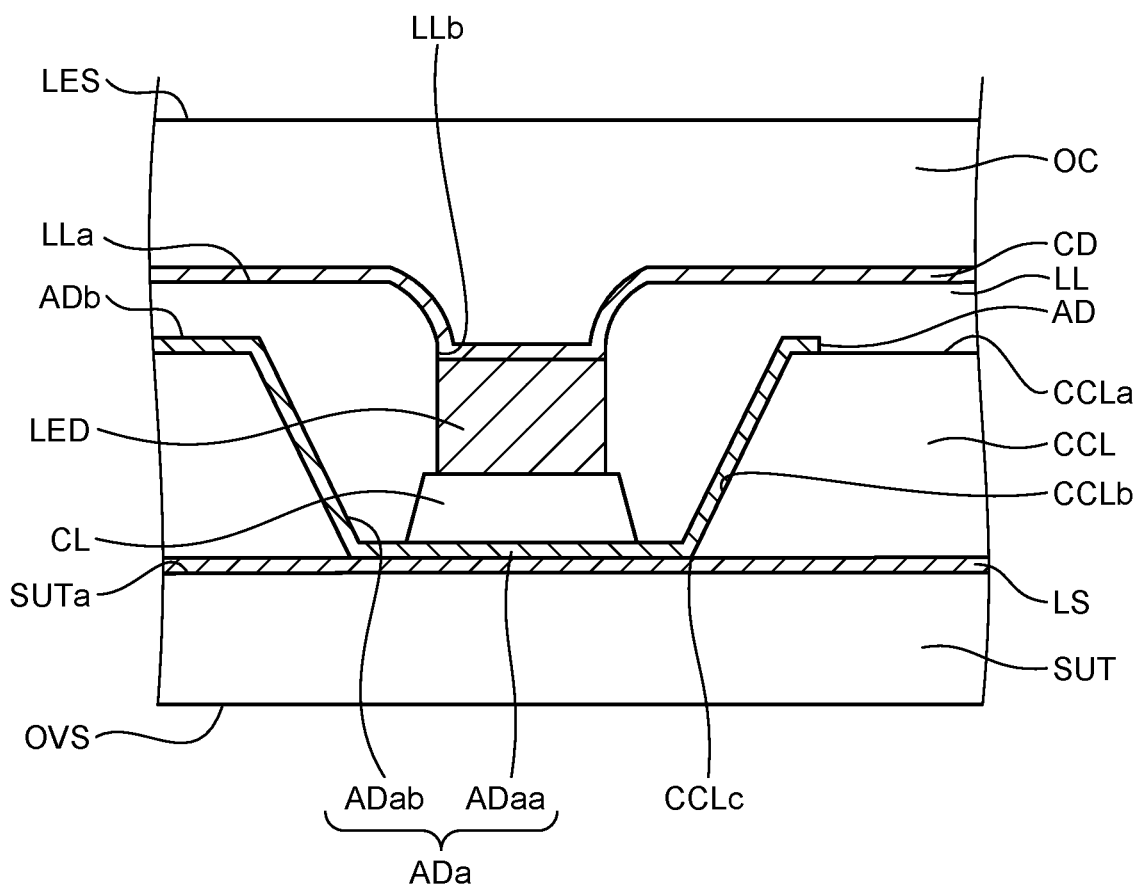
FIG. 16 is a cross-sectional view taken along line XVI-XVI' in FIG. 15.

FIG. 15 is a plan view of an illumination device according to a third embodiment. FIG. 16 is a cross-sectional view taken along line XVI-XVI' in FIG. 15. As illustrated in FIG. 15 and FIG. 16, a cathode electrode CD is provided continuously over the entire surface of the light emission surface LES across the anode electrodes AD and the light emitting elements LED. That is to say, one continuous cathode electrode CD is electrically coupled to the light emitting elements LED arrayed in the first direction Dx and the second direction Dy on the light emission surface LES. The cathode electrode CD is formed in what-is-called a flat, planar fashion. The cathode electrode CD can be made of a conductive material having translucency and, for example, ITO can be used therefor.

As illustrated in FIG. 15, light shielding layers LS are provided so as to overlap with the anode electrodes AD, respectively. Each of the first partial light shielding layers LSa overlaps with the first partial anode electrode ADa and has no portion overlapping with the first partial cathode electrode CDa (see FIG. 4) or the first partial cathode electrode CDc (see FIG. 12). The third embodiment can therefore reduce the area of the first partial light shielding layers LSa in comparison with the first embodiment and the second embodiment.

Each of the second partial light shielding layers LSb has no portion overlapping with the second partial cathode electrode CDd, thereby reducing the width thereof in the first direction Dx in comparison with the second embodiment. The third partial light shielding layers LSc (see FIG. 4) need not to be provided, so that the light shielding layers LS are not formed in the lattice form but formed in a stripe form. The illumination device FRL thereby enables an area ratio of regions having translucency to be equal to or greater than 85%.

As illustrated in FIG. 16, the cathode electrode CD is provided over the upper surface LLa and the opening LLb of the flattening layer LL and is electrically coupled to the light emitting element LED in the opening LLb. With this configuration, in comparison with the first embodiment and the second embodiment, the cathode coupling layers CDCN need not to be provided, thereby simplifying the layer structure.

The above-mentioned configurations in the first modification to the third modification can be also applied to the third embodiment. For example, the light shielding layers LS may be provided so as to be in contact with the anode electrodes AD, or the light shielding layers LS and the anode electrodes AD may be stacked with an insulating layer therebetween. In this case, the light shielding layers LS are provided along the upper surface CCLa of the resin layer CCL, the wall surfaces CCLb thereof, and the translucent substrate SUT at the bottom portions of the openings CCLc.

Fourth Embodiment

Figure 17:
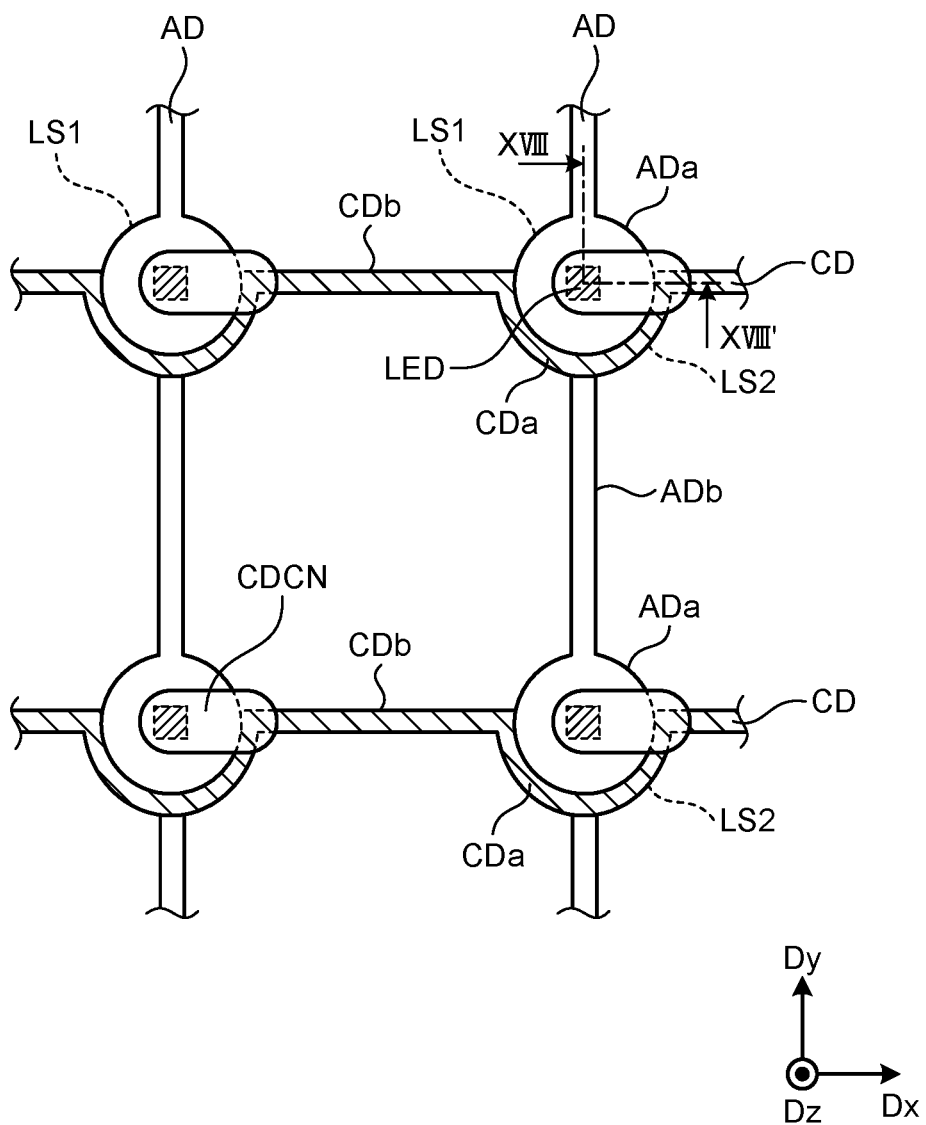
FIG. 17 is a plan view of an illumination device according to a fourth embodiment.
Figure 18:
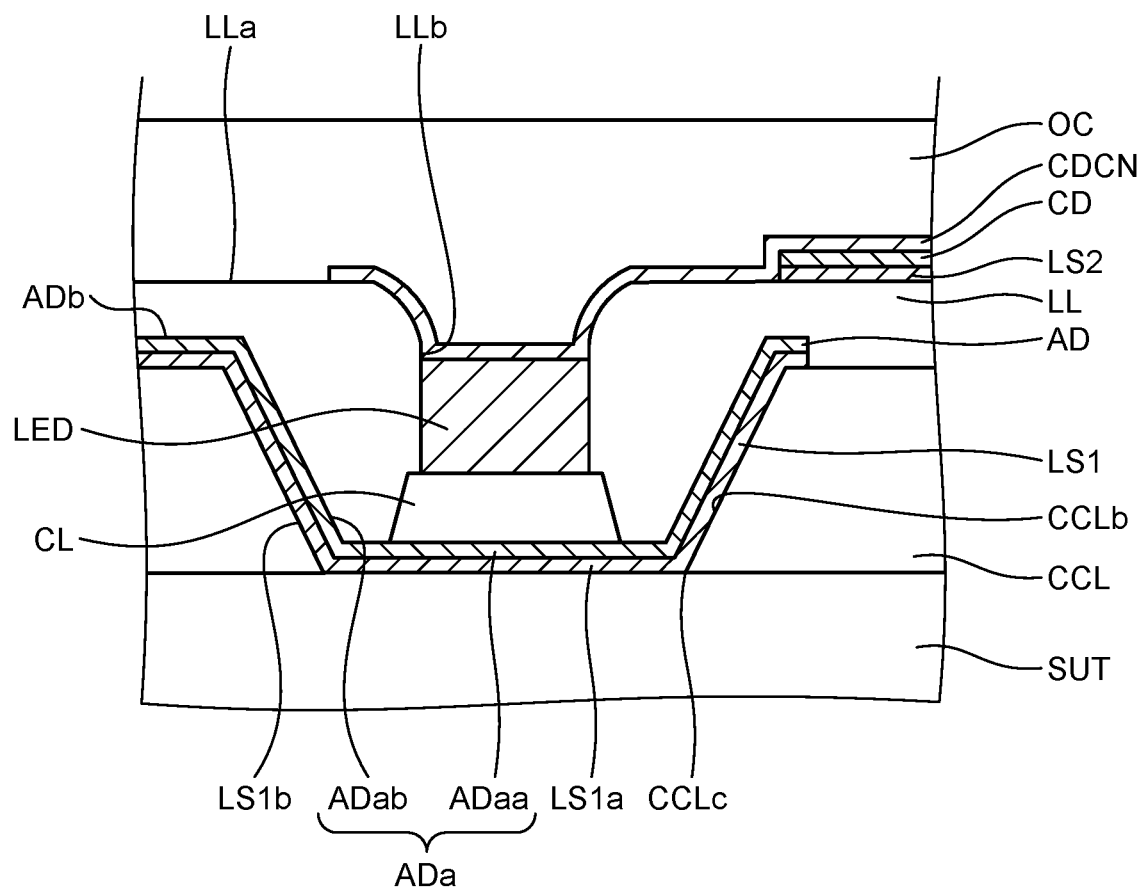
FIG. 18 is a cross-sectional view taken along line XVIII-XVIII' in FIG. 17.

FIG. 17 is a plan view of an illumination device according to a fourth embodiment. FIG. 18 is a cross-sectional view taken along line XVIII-XVIII' in FIG. 17. In the fourth embodiment, the illumination device FRL includes the first light shielding layers LS1 and the second light shielding layers LS2 in the same manner as the first modification. The first light shielding layers LS1 are provided in regions overlapping with the anode electrodes AD, and the second light shielding layers LS2 are provided in regions overlapping with the cathode electrodes CD.

The first light shielding layers LS1 and the anode electrodes AD are stacked and patterned in the fourth embodiment. The second light shielding layers LS2 and the cathode electrodes CD are stacked and patterned. The outer shape of the first light shielding layer LS1 is thereby the same as the outer shape of the anode electrode AD in plan view as illustrated in FIG. 17. The outer shape of the second light shielding layer LS2 is the same as the outer shape of the cathode electrode CD in plan view.

The positions of end portions of the first light shielding layer LS1 coincide with the positions of end portions of the anode electrode AD in cross-sectional shape as illustrated in FIG. 18. That is to say, the width of the first light shielding layer LS1 is equal to the width of the anode electrode AD. The positions of end portions of the second light shielding layer LS2 coincide with the positions of end portions of the cathode electrode CD in cross-sectional shape. That is to say, the width of the second light shielding layer LS2 is equal to the width of the cathode electrode CD. In the embodiment, examples of the configuration having the same width and the same outer shape may include not only the configuration in which the positions of the end portions thereof coincide with each other, but also a configuration having positional deviation generated therebetween in a manufacturing process, such as a configuration in which the end portions thereof are inclined by etching.

The first light shielding layers LS1 are made of titanium nitride as a material. A film of titanium nitride is formed, and then, a three-layered multilayered film of titanium (Ti), aluminum (Al), and titanium (Ti) that forms the anode electrodes AD is formed. These multilayered films are patterned in the same process, whereby the first light shielding layers LS1 and the anode electrodes AD are stacked and formed with the same width and the same outer shape. The second light shielding layers LS2 and the cathode electrodes CD can also be formed in a similar process.

Titanium nitride that is used for the first light shielding layers LS1 and the second light shielding layers LS2 is a metal film having low reflectivity, and a film thereof can be formed by reactive sputtering. The materials of the first light shielding layers LS1 and the second light shielding layers LS2 are not limited to titanium nitride, and metal nitride having low reflectivity can be used therefor.

Alternatively, a non-photosensitive organic film containing a black pigment can be used as the materials of the first light shielding layers LS1 and the second light shielding layers LS2. In this case, as the materials of the anode electrodes AD and the cathode electrodes CD that are stacked on the non-photosensitive organic film, a material enabling wet etching, such as a three-layered multilayered film of molybdenum (Mo), aluminum (Al), and molybdenum (Mo), can be used. After patterning the three-layered multilayered film of molybdenum (Mo), aluminum (Al), and molybdenum (Mo) by wet etching, and then, the non-photosensitive organic film may be wet-etched continuously to it. With this method, the first light shielding layers LS1 and the anode electrodes AD can be patterned into the same shape.

The areas of the first light shielding layers LS1 and the second light shielding layers LS2 of the illumination device FRL in the fourth embodiment can be reduced in comparison with the first embodiment. The area ratio of the regions having translucency in the light emission surface LES can therefore be increased. The illumination device FRL is thereby a bright planar light source that is excellent in translucency.

Fourth Modification of Fourth Embodiment

Figure 19:
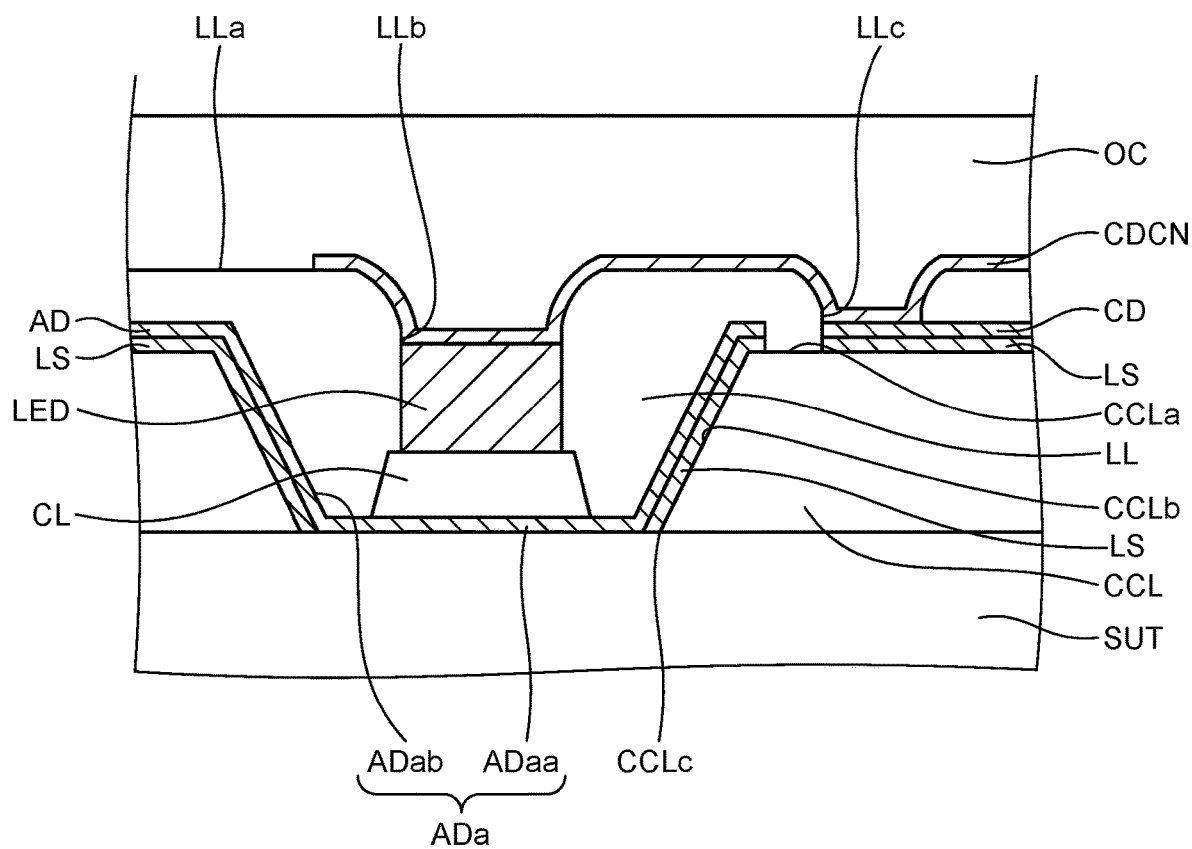
FIG. 19 is a cross-sectional view of an illumination device according to a fourth modification of the fourth embodiment.

FIG. 19 is a cross-sectional view of an illumination device according to a fourth modification of the fourth embodiment. A configuration illustrated in FIG. 19 is obtained by making the light shielding layers LS and the anode electrodes AD in the illumination device FRL in the second embodiment have the same width and the same outer shape, and making the light shielding layers LS and the cathode electrodes CD therein have the same width and the same outer shape. That is to say, the light shielding layers LS are not provided between the anode electrodes AD and the cathode electrodes CD aligned in the first direction Dx in FIG. 12, whereby translucency is improved. In this embodiment, the light shielding layers LS overlapping with the anode electrodes AD and the cathode electrodes CD can be formed in the same process, whereby the manufacturing process of the illumination device FRL can be simplified and an area ratio of regions having translucency can be increased.

Fifth Embodiment

Figure 20:
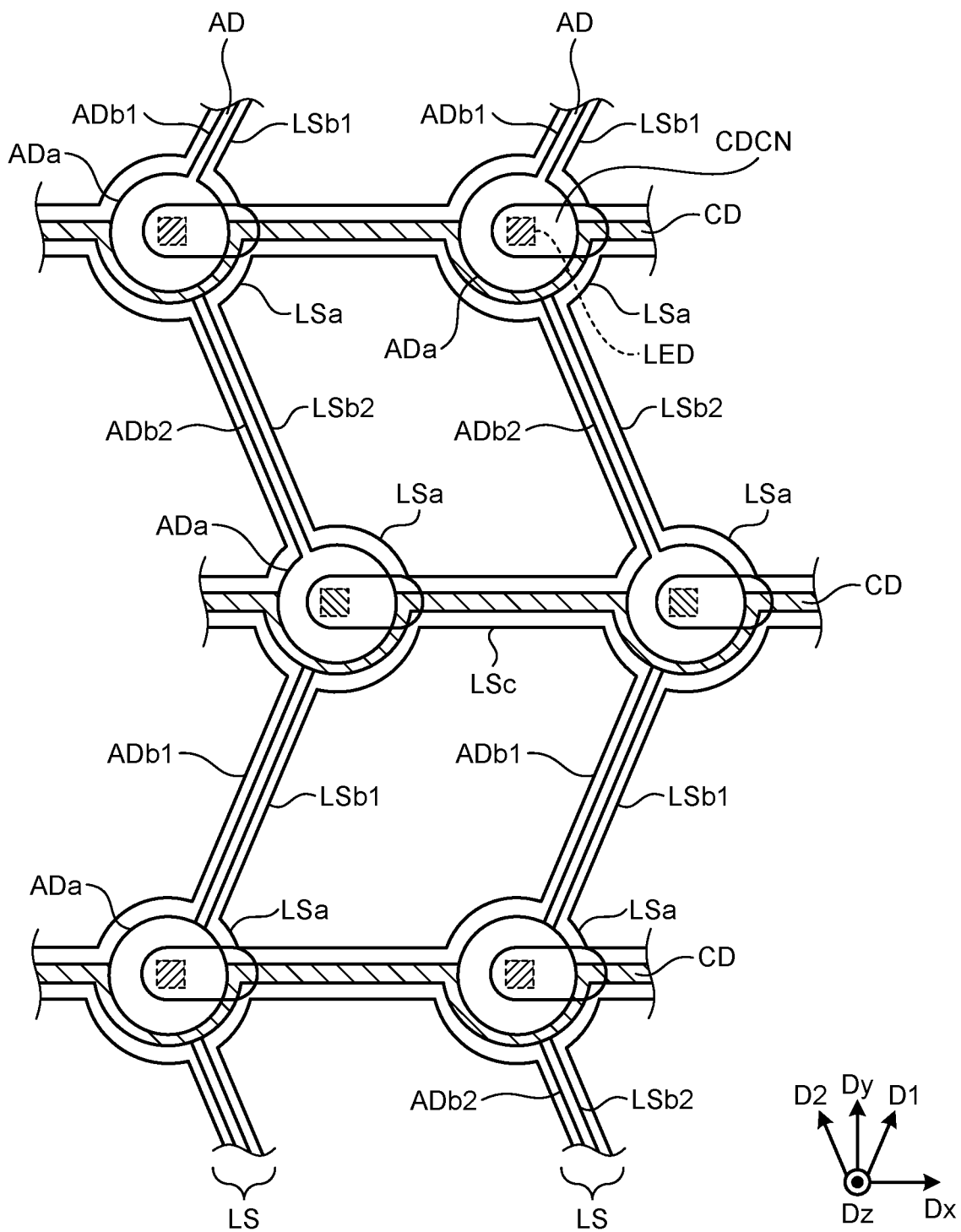
FIG. 20 is a plan view of an illumination device according to a fifth embodiment.

FIG. 20 is a plan view of an illumination device according to a fifth embodiment. The light emitting elements LED and the first partial anode electrodes ADa are arranged randomly on the translucent substrate SUT in the fifth embodiment. To be specific, the light emitting elements LED and the first partial anode electrodes ADa aligned in the second direction Dy are arranged such that positions thereof in the first direction Dx are different from each other, as illustrated in FIG. 20. The anode electrodes AD include second partial anode electrodes ADb1 provided along a direction D1 and second partial anode electrodes ADb2 provided along a direction D2. The direction D1 and the direction D2 are directions inclined to the opposite sides with respect to the second direction Dy. The second partial anode electrode ADb1 and the second partial anode electrode ADb2 are alternately arranged in the second direction Dy, and each of the anode electrodes AD is formed into a zigzag line shape. The light emitting element LED and the first partial anode electrode ADa are provided between the second partial anode electrode ADb1 and the second partial anode electrode ADb2.

Although the light emitting elements LED and the first partial anode electrodes ADa are arranged such that the positions thereof in the first direction Dx are different in FIG. 20, the arrangement thereof is not limited thereto. The light emitting elements LED and the first partial anode electrodes ADa aligned in the first direction Dx may be arranged such that positions thereof in the second direction Dy are different. In this case, the cathode electrodes CD are also inclined with respect to the first direction Dx so as not to overlap with the light emitting elements LED and the first partial anode electrodes ADa in accordance with the positions of the light emitting elements LED.

The positions of the light emitting elements LED in the first direction Dx are made different on a light emitting element LED basis in FIG. 20; however the positions of the light emitting elements LED may be made different on a light emitting element group basis, the group being composed of more than one light emitting element LED. For example, one light emitting element group may be composed of 100 light emitting elements LED in total in which 10 light emitting elements are aligned in the first direction Dx and 10 light emitting elements are aligned in the second direction Dy.

In the embodiment, the light emitting elements LED are thus randomly arranged on the translucent substrate SUT, and the anode electrodes AD and the cathode electrodes CD that are coupled thereto are also randomly arranged. The illumination device FRL can therefore reduce generation of moire.

Fifth Modification of Fifth Embodiment

Figure 21:
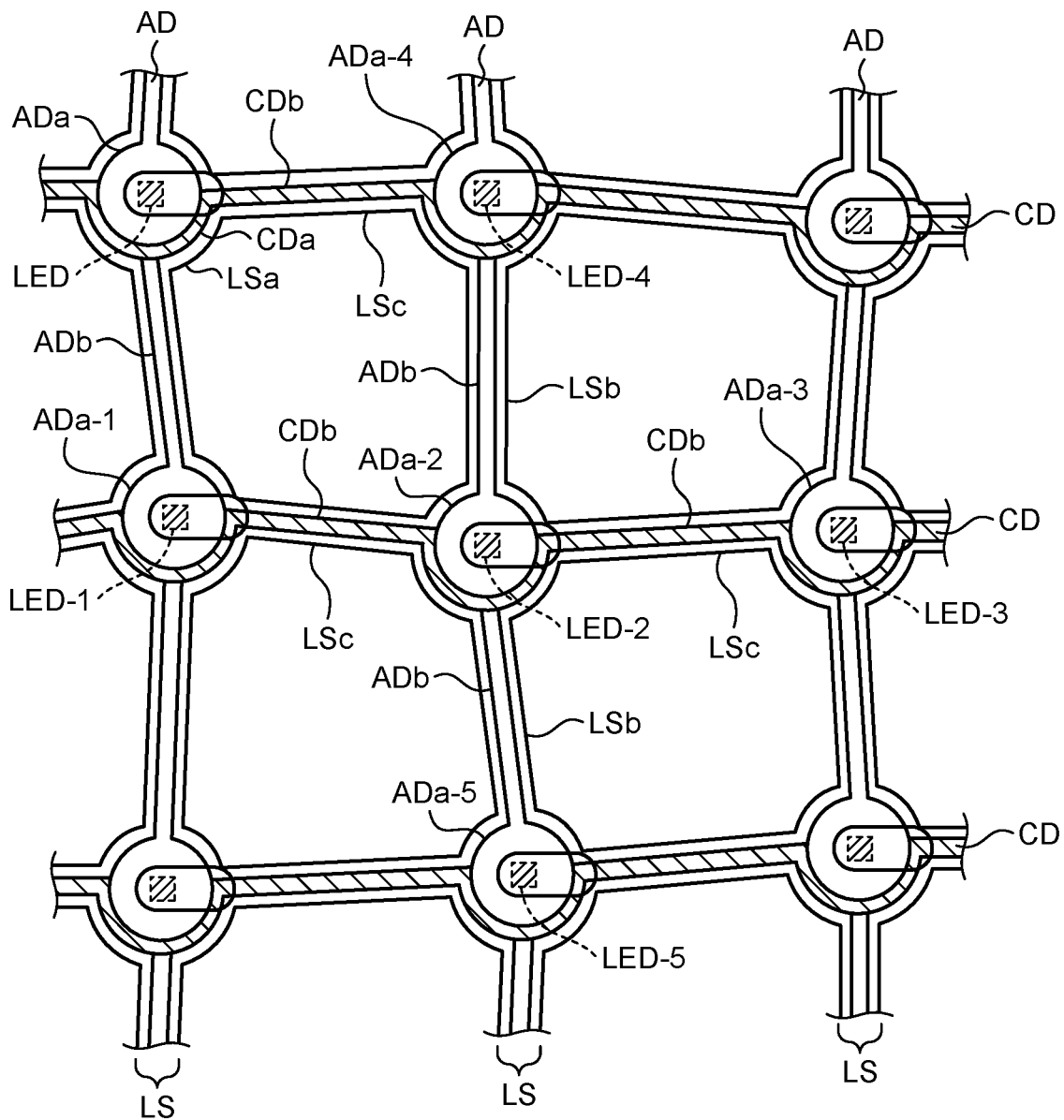
FIG. 21 is a plan view of an illumination device according to a fifth modification of the fifth embodiment.
Figure 21:
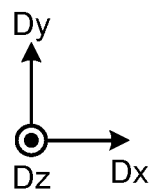

FIG. 21 is a plan view of an illumination device according to a fifth modification of the fifth embodiment. In the fifth modification illustrated in FIG. 21, the positions of the light emitting elements LED and the first partial anode electrodes ADa are arranged more randomly in comparison with the fifth embodiment. An example of a method for setting the positions of the light emitting elements LED and the first partial anode electrodes ADa is as follows. That is, the positions of the light emitting elements LED arranged in a matrix with the row-column configuration as illustrated in FIG. 4 are regarded as reference positions, and shift amounts and shift directions from the reference positions of the respective light emitting elements LED are determined with random numbers. Thus, the positions of the light emitting elements LED and the first partial anode electrodes ADa in the first direction Dx and the second direction Dy are determined so as to be random.

To be specific, the positions in the second direction Dy are different between light emitting elements LED-1, LED-2, and LED-3 and first partial anode electrodes ADa-1, ADa-2, and ADa-3 aligned in the first direction Dx, which are illustrated in FIG. 21. A distance between the light emitting element LED-1 and the light emitting element LED-2 in the first direction Dx is different from a distance between the light emitting element LED-2 and the light emitting element LED-3 in the first direction Dx. An inclination angle with respect to the first direction Dx is also different between the second partial cathode electrode CDb arranged between the light emitting element LED-1 and the light emitting element LED-2 and the second partial cathode electrode CDb arranged between the light emitting element LED-2 and the light emitting element LED-3.

Similarly, the positions in the first direction Dx are different between light emitting elements LED-4, LED-2, and LED-5 and first partial anode electrodes ADa-4, ADa-2, and ADa-5 aligned in the second direction Dy. A distance between the light emitting element LED-4 and the light emitting element LED-2 in the second direction Dy is different from a distance between the light emitting element LED-2 and the light emitting element LED-5 in the second direction Dy. An inclination angle with respect to the second direction Dy is also different between the second partial anode electrode ADb arranged between the light emitting element LED-4 and the light emitting element LED-2 and the second partial anode electrode ADb arranged between the light emitting element LED-2 and the light emitting element LED-5.

FIG. 21 illustrates nine light emitting elements LED arranged randomly. Light emitting element groups may be repeatedly arranged, where one emitting element group is composed of several tens to several hundreds of randomly arranged light emitting elements LED. In the fifth modification, regularity of the arrangement of the light emitting elements LED and the first partial anode electrodes ADa can be further lowered in comparison with the fifth embodiment illustrated in FIG. 20. The illumination device FRL can therefore enhance the effect of reducing generation of moire.

Sixth Embodiment

Figure 22:
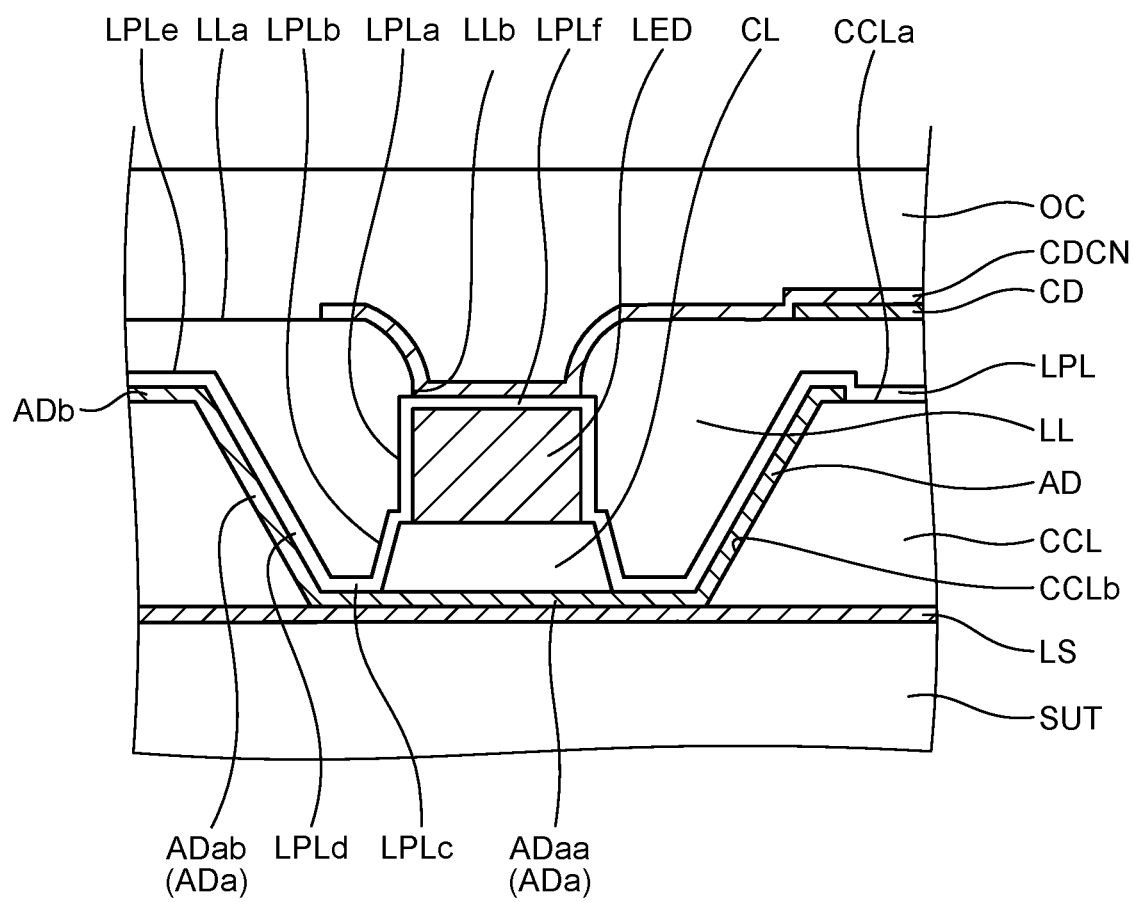
FIG. 22 is a cross-sectional view of an illumination device according to a sixth embodiment.

FIG. 22 is a cross-sectional view of an illumination device according to a sixth embodiment. As illustrated in FIG. 22, the illumination device FRL further includes light extraction layers LPL in the sixth embodiment. The light extraction layers LPL are inorganic insulating layers having translucency and cover the anode electrode AD and at least parts of the light emitting elements LED. To be specific, each of the light extraction layers LPL is a titanium oxide layer having a film thickness of about 300 nm, for example. The light extraction layer LPL can be film-formed by a CVD method after the light emitting elements LED are arranged on the coupling layers CL.

The light extraction layers LPL cover at least parts of light emitting elements LED. The light extraction layers LPL surround the upper surfaces and the side surfaces of the light emitting elements LED and are provided also at the peripheries of the light emitting elements LED. To be specific, each of the light extraction layers LPL includes a side portion LPLa, an inclined portion LPLb, an extension portion LPLc, an opposing portion LPLd, an outer edge portion LPLe, and a top portion LPLf.

The side portion LPLa is provided so as to surround the side surface of the light emitting element LED. The inclined portion LPLb is coupled to the lower end of the side portion LPLa and is provided between the side portion LPLa and the extension portion LPLc. The inclined portion LPLb is provided along the side surface of the coupling layer CL and is inclined with respect to the side portion LPLa.

The extension portion LPLc is provided on or above the anode-electrode bottom portion ADaa and is coupled to the lower end of the inclined portion LPLb. In other words, the anode electrode AD is provided between the light shielding layer LS and the extension portion LPLc in the normal direction of the translucent substrate SUT. That is to say, the extension portion LPLc is provided on the lower end side of the side portion LPLa and extends to the outside of the side portion LPLa located outside the light emitting element LED, that is, in the direction of being separated from the side surface of the light emitting element LED in plan view.

The opposing portion LPLd opposes the side surface of the light emitting element LED. To be specific, the opposing portion LPLd is coupled to an end portion of the extension portion LPLc and is inclined along the wall surface CCLb of the resin layer CCL and the anode-electrode inclined portion ADab. The anode-electrode inclined portion ADab and the opposing portion LPLd are stacked on the wall surface CCLb of the resin layer CCL in the order as listed.

The outer edge portion LPLe is coupled to the upper end of the opposing portion LPLd and provided on the second partial anode electrode ADb and the upper surface CCLa of the resin layer CCL.

The top portion LPLf is coupled to the upper end of the side portion LPLa and is provided on the upper surface of the light emitting element LED. In other words, the top portion LPLf is provided between the upper surface of the light emitting element LED and the cathode coupling layer CDCN.

The flattening layer LL covers at least the side surfaces of the light emitting elements LED and the light extraction layers LPL and is provided above the resin layer CCL. The openings LLb of the flattening layer LL are provided in regions overlapping with the top portions LPLf.

The light extraction layers LPL are not limited to have the configuration illustrated in FIG. 22 and may be appropriately modified. For example, the opposing portions LPLd and the outer edge portions LPLe may not be provided. Alternatively, the top portions LPLf may not be provided on the upper surfaces of the light emitting elements LED.

Figure 23:
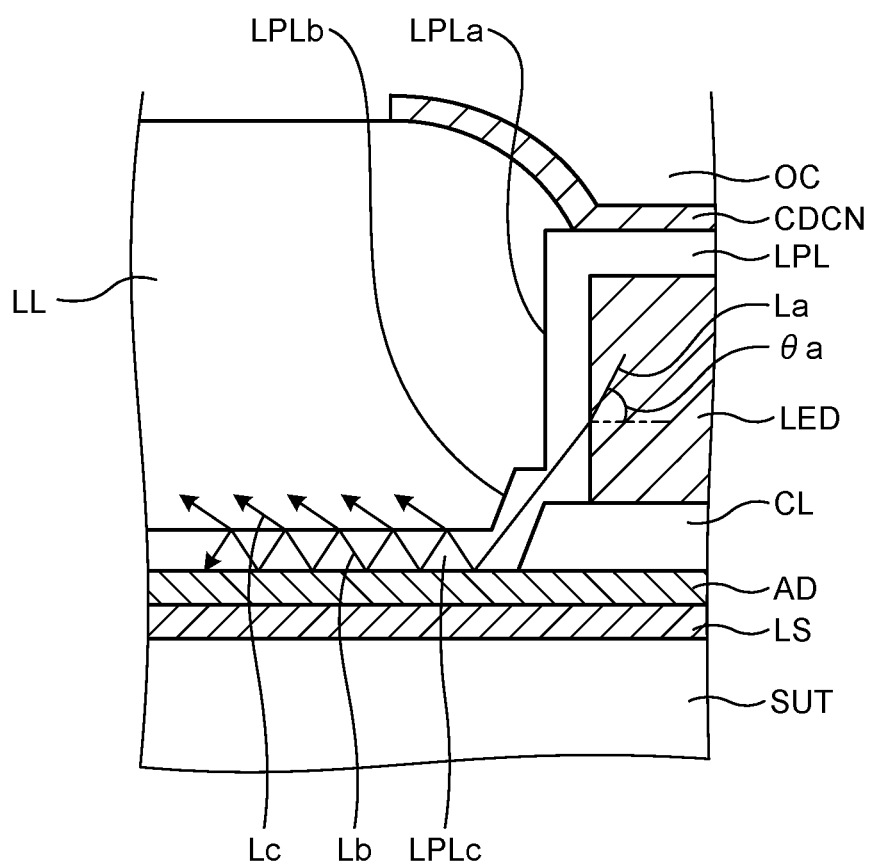
FIG. 23 is a descriptive view for explaining a state of light emitted from a light emitting element that propagates through a light extraction layer.

FIG. 23 is a descriptive view for explaining a state of light emitted from the light emitting element that propagates through the light extraction layer. Easiness of incidence of the light La from the light emitting element LED on a layer close to the light emitting element LED is expressed by a total reflection angle $\theta r$. The total reflection angle $\theta r$ is an incident angle at which the light La generated in the light emitting element LED is totally reflected by an interface with the close layer. As illustrated in FIG. 23, an incident angle $\theta a$ of the light La incident on the side portion LPLa is an angle formed by the normal direction of the side surface (surfaces) of the light emitting element LED and the traveling direction of the light La. A transmission component is present when the incident angle θa is equal to or less than the total reflection angle θr. That is, the larger the total reflection angle θr is, the easier the light La is incident on the close layer.

Assuming that a refractive index of the light emitting element LED is $n_{LED}$ and a refractive index of the close layer is $n_{AJ}$, the total reflection angle θr is expressed by the following equation (1).

$$\theta r = \arcsin(n_{AJ}/n_{LED}) \quad (1)$$

When a relation of $n_{AJ} > n_{LED}$ is satisfied, the light La can be incident on the close layer at all incident angles θa. When $n_{AJ} < n_{LED}$ is satisfied, as $n_{AJ}$ is larger, the total reflection angle θr is larger, and thus the component of the light La that is incident on the close layer is increased.

The side portion LPLa of the light extraction layer LPL is provided between the side surface (surfaces) of the light emitting element LED and the flattening layer LL in this embodiment. The refractive index $n_{LED}$ of the light emitting element LED is, for example, $n_{LED}=2.4$, and the refractive index of the flattening layer LL is, for example, 1.5. The refractive index of the light extraction layer LPL is about $n_{AJ}=2.4$ and is larger than the refractive index of the flattening layer LL. That is to say, a difference between the refractive index of the light extraction layer LPL and the refractive index $n_{LED}$ of the light emitting element LED is smaller than a difference between the refractive index of the flattening layer LL and the refractive index of the light emitting element LED. In this embodiment, the total reflection angle θr at an interface between the light emitting element LED and the side portion LPLa is therefore increased to cause the light La from the light emitting element LED to be incident on the side portion LPLa more easily in comparison with the case in which the flattening layer LL is provided so as to be in contact with the side surface (surfaces) of the light emitting element LED. Although the refractive index $n_{LED}$ of the light emitting element LED is the same as the refractive index mu of the light extraction layer LPL, they may be different from each other.

The inclined portion LPLb is provided between the side portion LPLa and the extension portion LPLc, so that an angle formed by the side portion LPLa and the inclined portion LPLb and an angle formed by the extension portion LPLc and the inclined portion LPLb are moderate in comparison with the case in which the side portion LPLa and the extension portion LPLc are directly connected to each other. Light Lb incident on the side portion LPLa is thereby well-guided to the extension portion LPLc through the inclined portion LPLb.

The flattening layer LL is provided on the upper side of the extension portion LPLc, and the anode electrode AD is provided on the lower side thereof. The light Lb thereby propagates in the direction of being separated from the light emitting element LED while being reflected in the extension portion LPLc. In this process, when the incident angle of the light Lb is smaller than the total reflection angle at the interface between the extension portion LPLc and the flattening layer LL, light Lc is output upward. Although not illustrated in FIG. 23, the light Lb propagates also to the opposing portion LPLd and the outer edge portion LPLe, and the light Lc is output upward. Thus, the light extraction layer LPL is provided in this embodiment, whereby the light La from the light emitting element LED can be output from the entire surface of the light extraction layer LPL. The illumination device FRL can thereby improve light extraction efficiency.

The light extraction layers LPL can propagate the light Lb. Thus, the light Lb does not propagate to portions of the light emission surface LES that have translucency, by separating the light extraction layers LPL for the respective light emitting elements LED from one another. For example, the light extraction layers LPL may be formed in only the recessed structures formed by the resin layer CCL and the first partial anode electrodes ADa.

Although each of the light extraction layers LPL is formed of the titanium oxide layer as the material, the material is not limited thereto. A material having a high refractive index and translucency is preferable as the material of the light extraction layers LPL, and for example, tantalum oxide, niobium oxide, or barium titanate can be applied. The thickness of the light extraction layer LPL is merely an example and can be appropriately changed.

Sixth Modification of Sixth Embodiment

Figure 24:
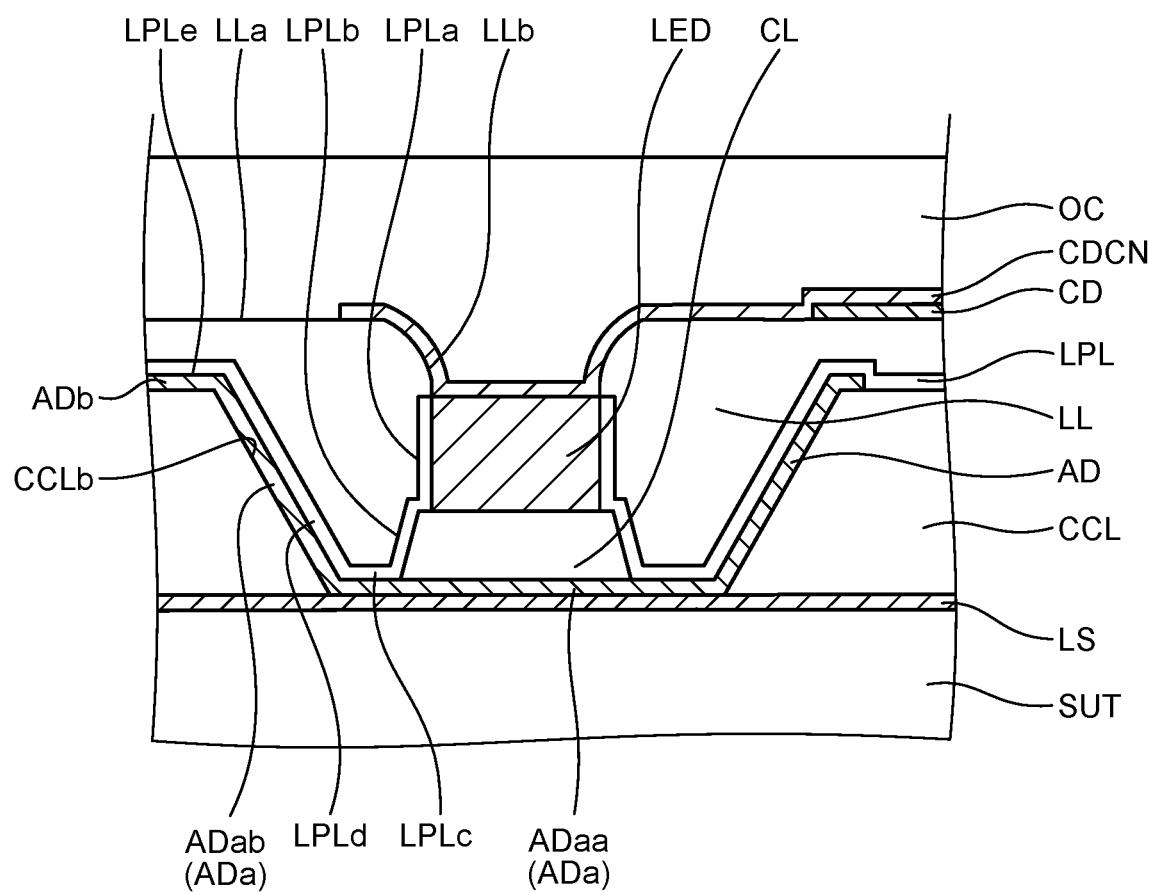
FIG. 24 is a cross-sectional view of an illumination device according to a sixth modification of the sixth embodiment.

FIG. 24 is a cross-sectional view of an illumination device according to a sixth modification of the sixth embodiment. As illustrated in FIG. 24, the top portions LPLf of the light extraction layers LPL are not provided in the sixth modification. That is to say, each of the light extraction layers LPL has the side portion LPLa, the inclined portion LPLb, the extension portion LPLc, the opposing portion LPLd, and the outer edge portion LPLe; and the upper surface of the light emitting element LED is exposed to the bottom portion of the opening LLb of the flattening layer LL. Each of the upper surfaces of the light emitting elements LED is in direct contact with the cathode coupling layer CDCN in the opening LLb. In other words, the cathode terminal ELED2 (see FIG. 7) of the light emitting element LED is in direct contact with the cathode electrode CD. With this configuration, the sixth modification can reduce coupling resistance between the cathode terminal ELED2 and the cathode electrode CD, thereby reducing drive voltage (anode power supply potential).

Seventh Modification of Sixth Embodiment

Figure 25:
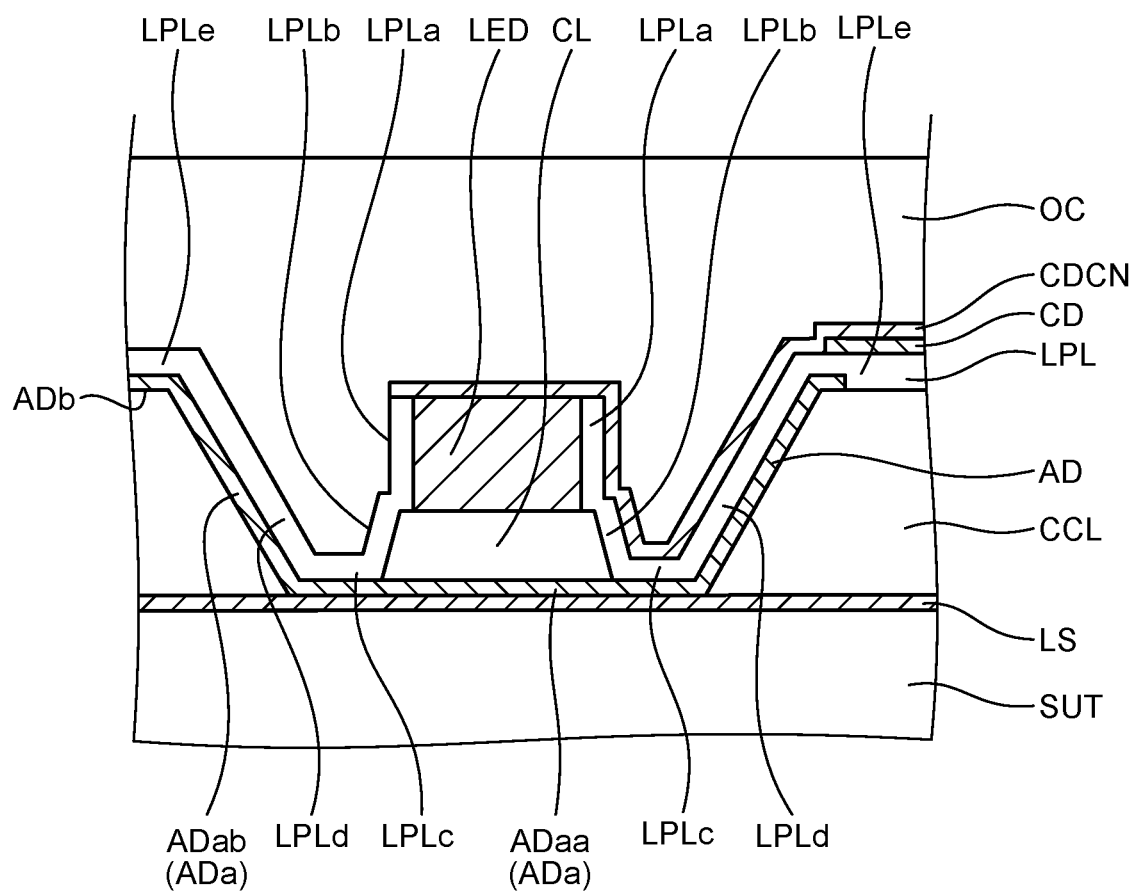
FIG. 25 is a cross-sectional view of an illumination device according to a seventh modification of the sixth embodiment.

FIG. 25 is a cross-sectional view of an illumination device according to a seventh modification of the sixth embodiment. As illustrated in FIG. 25, the flattening layer LL is not provided and the cathode electrodes CD and the cathode coupling layers CDCN are provided on the light extraction layer LPL in the seventh modification. To be specific, the cathode coupling layer CDCN is provided so as to overlap with the side portion LPLa, the inclined portion LPLb, the extension portion LPLc, the opposing portion LPLd, and the outer edge portion LPLe of the light extraction layer LPL. The cathode electrode CD and the cathode coupling layer CDCN are insulated from the anode electrode AD by the light extraction layer LPL therebetween. The top portion LPLf is not provided and the cathode electrode CD is electrically coupled to the cathode terminal ELED2 of the light emitting element LED also in the seventh modification.

The overcoat layer OC is provided on or above the cathode electrodes CD and the cathode coupling layers CDCN. The overcoat layer OC is formed in recessed structures formed by the resin layer CCL and the first partial anode electrodes ADa. The overcoat layer OC covers the side surfaces and the upper surfaces of the light emitting elements LED and is formed to be higher than the light emitting elements LED such that the upper surfaces thereof are flattened. In the seventh modification, the flattening layer LL can be omitted, whereby manufacturing cost of the illumination device FRL can be reduced in comparison with the sixth embodiment and the sixth modification as described above.

Eighth Modification of Sixth Embodiment

Figure 26:
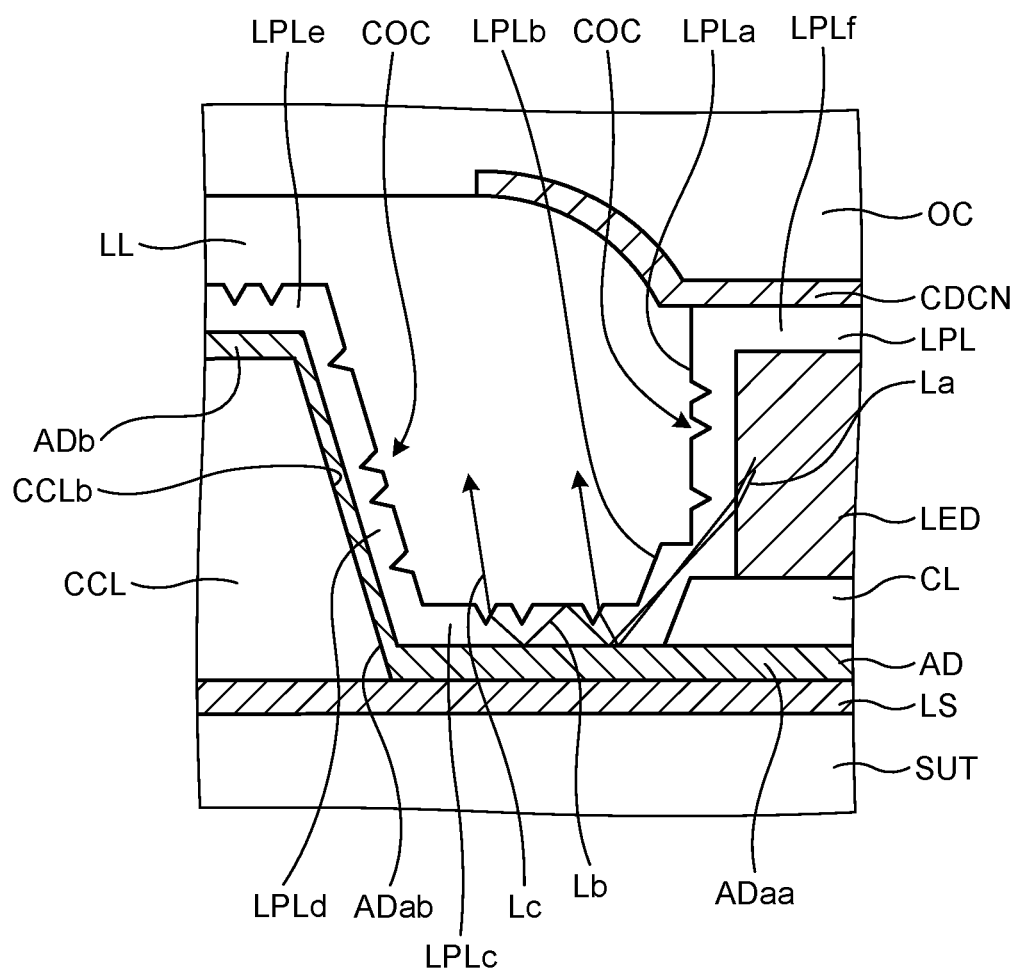
FIG. 26 is a cross-sectional view of an illumination device according to an eighth modification of the sixth embodiment.

FIG. 26 is a cross-sectional view of an illumination device according to an eighth modification of the sixth embodiment. As illustrated in FIG. 26, a plurality of fine recesses COC are provided in the surfaces of the light extraction layer LPL in the eighth modification. The recesses COC are provided in the side portion LPLa, the extension portion LPLc, the opposing portion LPLd, and the outer edge portion LPLe. The recesses COC may be provided also in the inclined portion LPLb. The recesses COC can be formed by grinding the surfaces of the light extraction layer LPL and can be formed by, for example, a method of spraying a polishing agent such as sand blast onto the light extraction layer LPL.

The light Lb propagating in the extension portion LPLc is reflected by regions with no recess COC on the interface between the extension portion LPLc and the flattening layer LL. The interface is locally inclined in regions with the recesses COC, and the incident angle of the light Lb in the regions with the recesses COC is different from that in the regions with no recess COC. Consequently, the light Lc is output to the flattening layer LL side efficiently.

Ninth Modification of Sixth Embodiment

Figure 27:
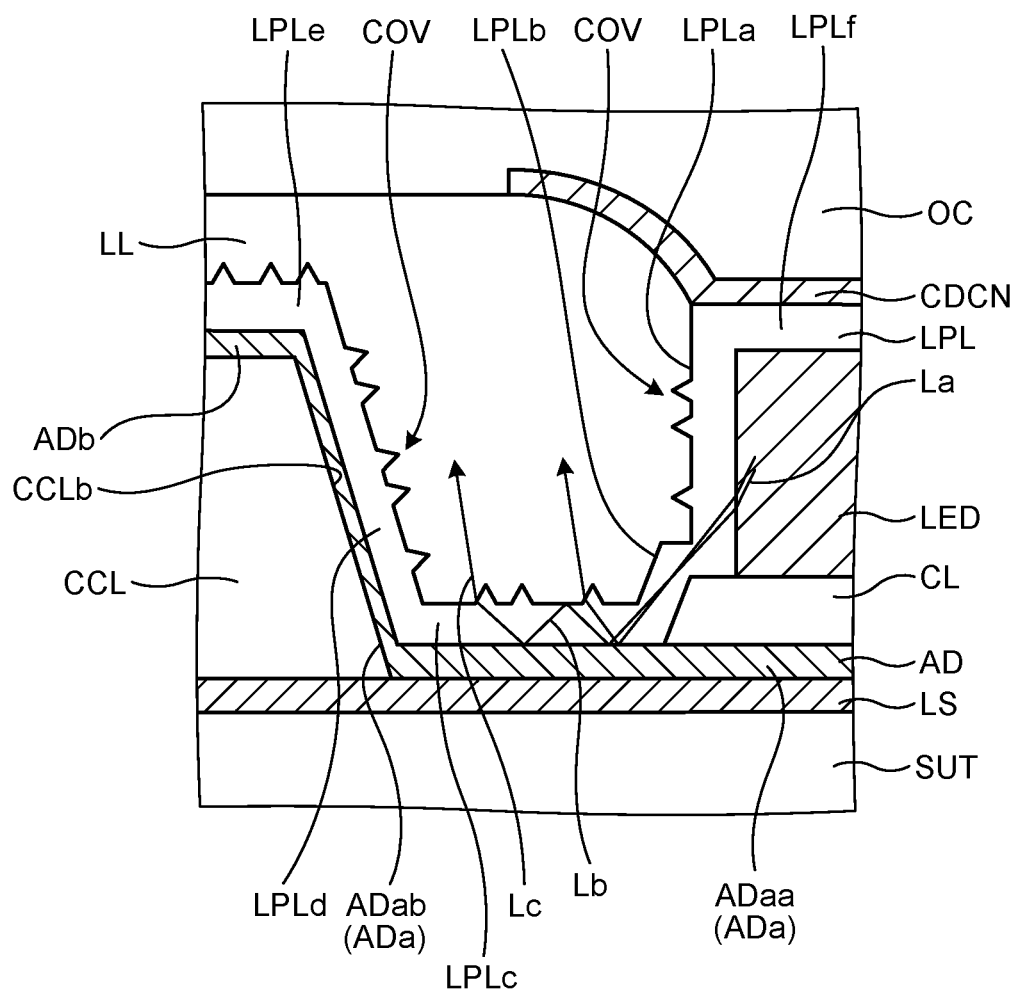
FIG. 27 is a cross-sectional view of an illumination device according to a ninth modification of the sixth embodiment.

FIG. 27 is a cross-sectional view of an illumination device according to a ninth modification of the sixth embodiment. As illustrated in FIG. 27, a plurality of fine projections COV are provided on the surfaces of the light extraction layer LPL in the ninth modification. The projections COV are provided on the side portion LPLa, the extension portion LPLc, the opposing portion LPLd, and the outer edge portion LPLe. The projections COV may be provided also on the inclined portion LPLb. The projections COV can be formed by applying the same material as that of the light extraction layer LPL, for example, fine particles of titanium oxide, thereonto. To be more specific, the flattening layer LL is formed by mixing the fine particles of titanium oxide into an organic material for forming the flattening layer LL, and some of the fine particles in the flattening layer LL are applied onto the surfaces of the light extraction layer LPL to form the projections COV.

The interface is locally inclined in regions with the projections COV, and the incident angle of the light Lb in the regions with the projections COV is different from that in the regions with no projection COV also in the ninth modification. Consequently, the light Lc is output to the flattening layer LL side efficiently. The configuration is not limited to those illustrated in FIG. 26 and FIG. 27, and a structure having a plurality of microscopic asperities may be formed on the surfaces of the light extraction layer LPL. To be specific, the structure having a plurality of microscopic asperities may be formed by roughening the surfaces of the light extraction layer LPL by a reverse sputtering method or the like.

Tenth Modification of Sixth Embodiment

Figure 28:
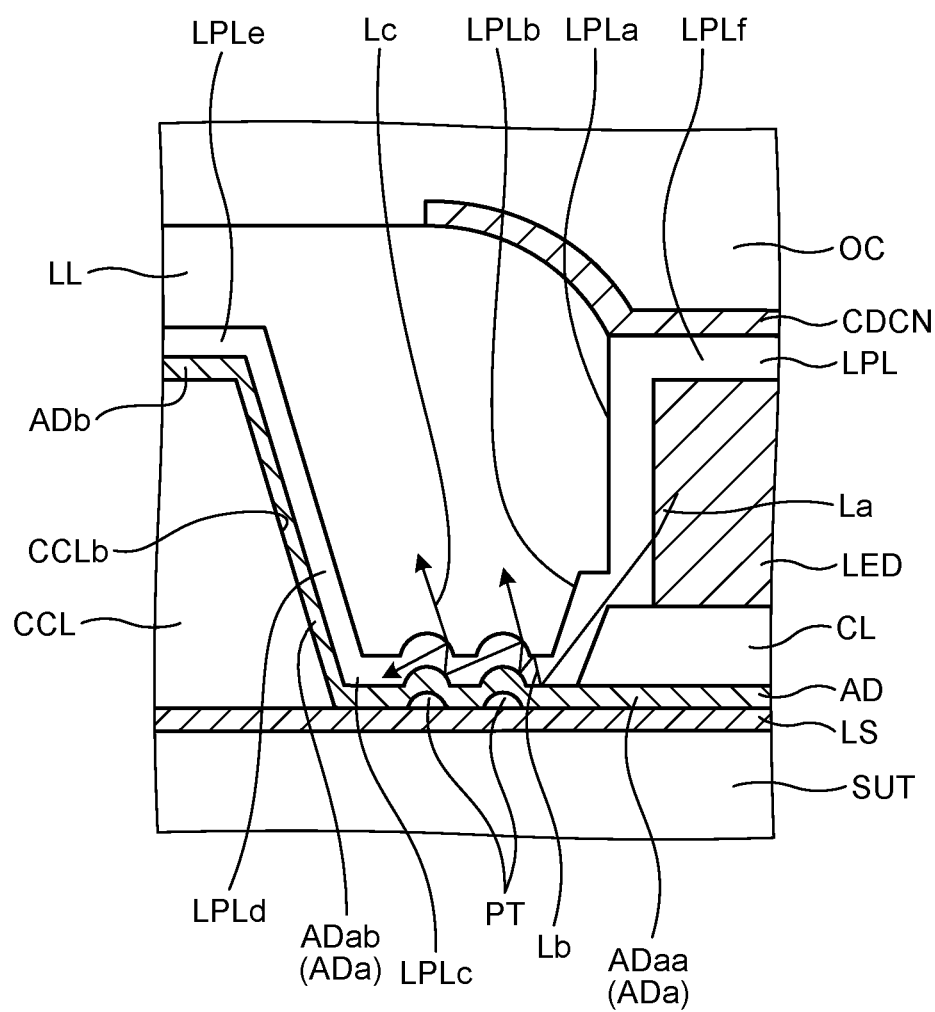
FIG. 28 is a cross-sectional view of an illumination device according to a tenth modification of the sixth embodiment.

FIG. 28 is a cross-sectional view of an illumination device according to a tenth modification of the sixth embodiment. As illustrated in FIG. 28, a plurality of projecting structures PT are provided on the light shielding layer LS in the tenth modification. The projecting structures PT can be formed by patterning an organic resist on the light shielding layer LS. Thereafter, the organic resist is hardened while being molten by performing heat processing thereon, so that the projecting structures PT each have a semi-circular cross-sectional structure with a curved surface.

The anode electrode AD and the extension portion LPLc are provided on or above the light shielding layer LS and the projecting structures PT. A plurality of projections shaped in conformance with the projecting structures PT are formed also on portions of the anode electrode AD that overlap with the extension portion LPLc. A plurality of projections shaped in conformance with the projecting structures PT are formed also on the surface of the extension portion LPLc.

Interface between the anode electrode AD and the extension portion LPLc is locally inclined in portions with the projections, and a reflection angle of the light Lb in the portions becomes different from the other portions. The traveling direction of the light Lb changes between the portions with the projections and the portions with no projection. A component of the light Lb that travels in the normal direction of the interface between the extension portion LPLc and the flattening layer LL is increased, and the light Lc can be transmitted to the flattening layer LL. The interface between the extension portion LPLc and the flattening layer LL is also locally inclined in portions with the projections. The incident angle of the light Lb is different between the portions with the projections and the portions with no projection. Consequently, the light Lc is output to the flattening layer LL side efficiently.

Eleventh Modification of Sixth Embodiment

Figure 29:
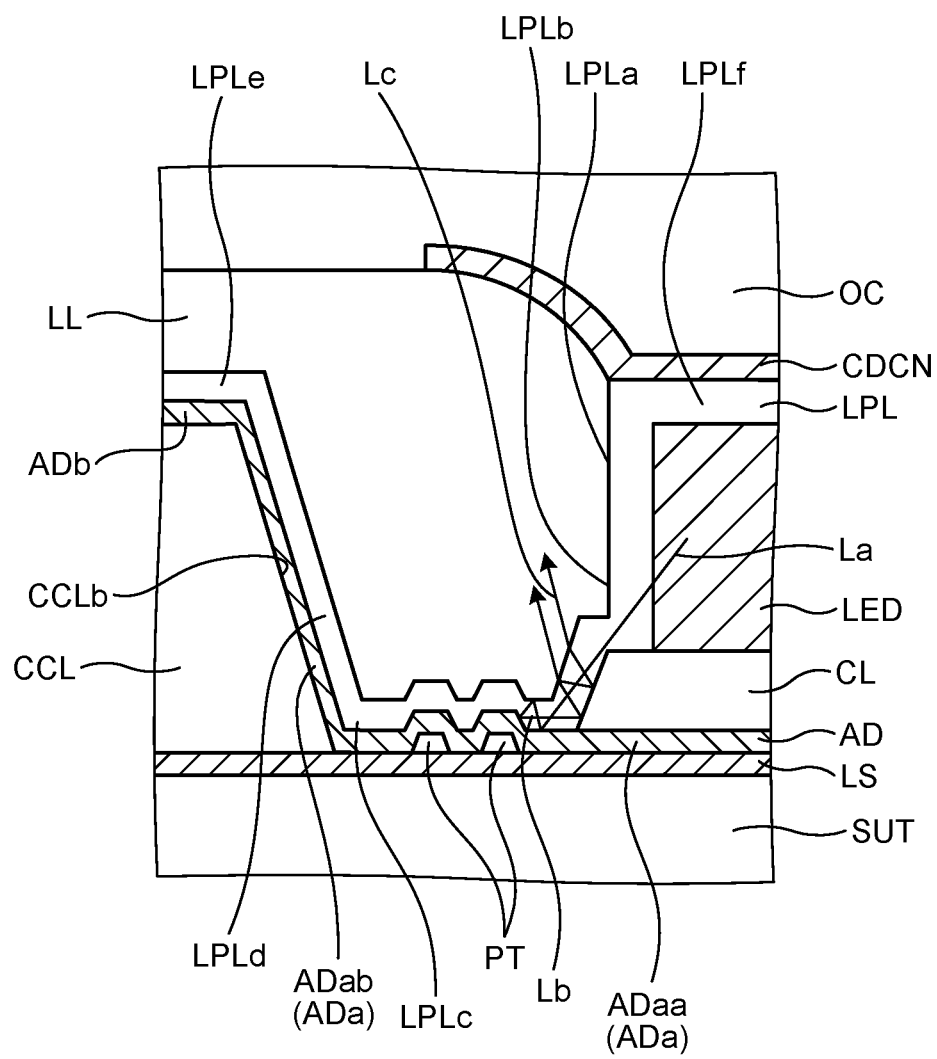
FIG. 29 is a cross-sectional view of an illumination device according to an eleventh modification of the sixth embodiment.

FIG. 29 is a cross-sectional view of an illumination device according to an eleventh modification of the sixth embodiment. As illustrated in FIG. 29, a plurality of projecting structures PT provided on the light shielding layer LS each have a trapezoidal cross-sectional shape in the eleventh modification. The projecting structures PT can be formed by performing heat processing at a temperature lower than a melting temperature of an organic resist.

A plurality of projections shaped in conformance with the projecting structures PT are formed on the anode electrode AD and the extension portion LPLc also in the eleventh modification. A part of the light Lb is reflected by the side surfaces of the projections formed on the anode electrode AD, and the traveling direction thereof is changed. The light Lb reflected by the side surfaces of the projections is further reflected by the surface of the coupling layer CL. The light Lc is output upward from the inclined portion LPLb. FIG. 29 omits illustration of the light Lb traveling in the extension portion LPLc in order to make the drawing easy to view. In the same manner as the above-mentioned tenth modification, the projections formed on the anode electrode AD and the extension portion LPLc enable the light Lc to be output to the flattening layer LL side efficiently also in the eleventh modification.

Seventh Embodiment

Figure 30:
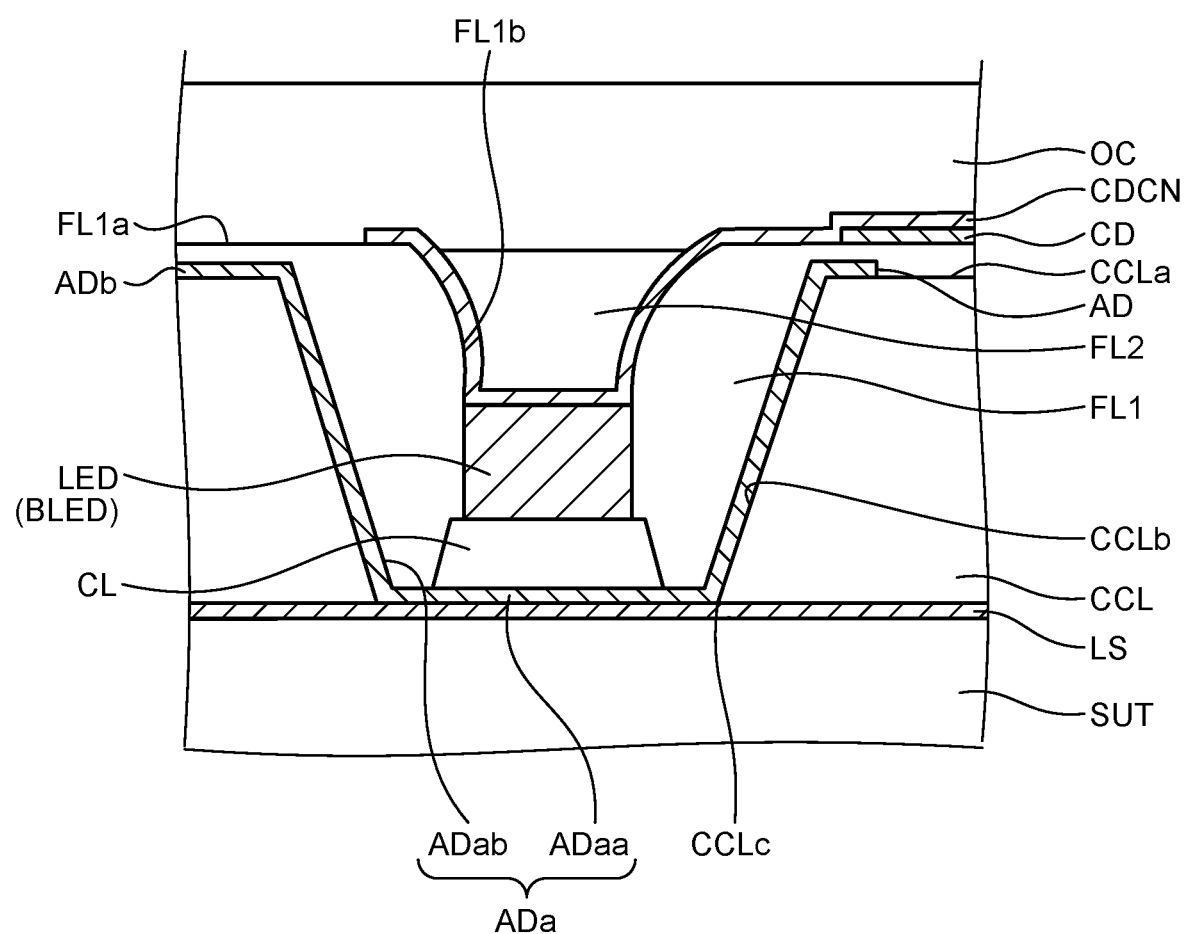
FIG. 30 is a cross-sectional view of an illumination device according to a seventh embodiment.

FIG. 30 is a cross-sectional view of an illumination device according to a seventh embodiment. As illustrated in FIG. 30, the illumination device FRL in the seventh embodiment includes a first phosphor layer FL1 and second phosphor layers FL2. Each of the first phosphor layer FL1 and the second phosphor layers FL2 converts the wavelength of light output from the light emitting element LED and output light in a different color.

The first phosphor layer FL1 is provided instead of the above-mentioned flattening layer LL and covers the side surfaces of the light emitting elements LED. The first phosphor layer FL1 is formed in recessed structures formed by the resin layer CCL and the first partial anode electrodes ADa and is provided also on the upper surface CCLa of the resin layer CCL. The first phosphor layer FL1 has openings FL1b in regions overlapping with the upper surfaces of the light emitting elements LED. Each of the cathode coupling layers CDCN is provided on an upper surface FL1a of the first phosphor layer FL1 and is electrically coupled to the light emitting element LED in the opening FL1b. The second phosphor layer FL2 is provided in the opening FL1b and covers the upper surface of the light emitting element LED.

A blue light emitting element BLED is used as each of the light emitting elements LED in the seventh embodiment. A red phosphor that emits red fluorescent light and a green phosphor that emits green fluorescent light are respectively used for the first phosphor layer FL1 and the second phosphor layer FL2. The illumination device FRL thereby outputs white light provided by combining light output from the blue light emitting element BLED and the fluorescent light from the first phosphor layer FL1 and the second phosphor layer FL2.

The first phosphor layer FL1 is formed by patterning a negative resist with red light-emitting quantum dots mixed. The second phosphor layer FL2 is formed by patterning a negative resist with green light-emitting quantum dots mixed. The first phosphor layer FL1 may be the green phosphor, and the second phosphor layers FL2 may be the red phosphors.

The quantum dot is configured with a core structure made of cadmium selenide (CdSe) and a shell structure made of zinc sulfide (ZnS) that surrounds the core structure. The particle diameters of the quantum dots are adjusted such that the green phosphor exhibits a maximum fluorescent wavelength at the wavelength of 530 nm and the red phosphor exhibits a maximum fluorescent wavelength at the wavelength of 630 nm. The absorption spectra of the quantum dots are continuous, and the quantum dots provide sufficient absorption even at the maximum fluorescent wavelength of the blue light emitting elements BLED. The surface of the shell structure has organic molecular chains in order to improve compatibility with the negative resists. The quantum dots are not limited thereto, and non-cadmium quantum dots can also be applied. Examples of the non-cadmium quantum dot include a quantum dot configured with a core structure made of indium phosphide (InP) and a shell structure made of zinc sulfide (ZnS). The red phosphor and the green phosphor are not limited to the quantum dots, and organic low molecules or organometal complexes can be used.

The first phosphor layer FL1 and the second phosphor layers FL2 emit light isotropically. Light emitted from the first phosphor layer FL1 and the second phosphor layers FL2 contains a component traveling to the translucent substrate SUT side and a component traveling in a direction parallel to the translucent substrate SUT. The anode electrode AD is provided on the side surfaces of and on the lower sides of the first phosphor layer FL1 and the second phosphor layers FL2. The anode-electrode inclined portion ADab provided on the wall surface CCLb are inclined.

With this configuration, light emitted from the first phosphor layer FL1 and the second phosphor layer FL2 is reflected by the anode electrode bottom portion ADaa and the anode-electrode inclined portion ADab, and the traveling direction thereof is changed to an upward direction, that is, a direction toward the display unit PNL (see FIG. 1) side. Thus, the light extraction efficiency of the illumination device FRL can be improved even when the first phosphor layer FL1 and the second phosphor layers FL2 are provided.

In the embodiment, the first phosphor layer FL1 and the second phosphor layers FL2 are provided, so that white light can be output without mixing emitted light components in three colors from the red light emitting element, the green light emitting element, and the blue light emitting element. That is to say, only the blue light emitting elements BLED can be used as the light emitting elements LED. This can therefore simplify an array process of the light emitting elements LED in the manufacturing process of the illumination device FRL.

Figure 31:
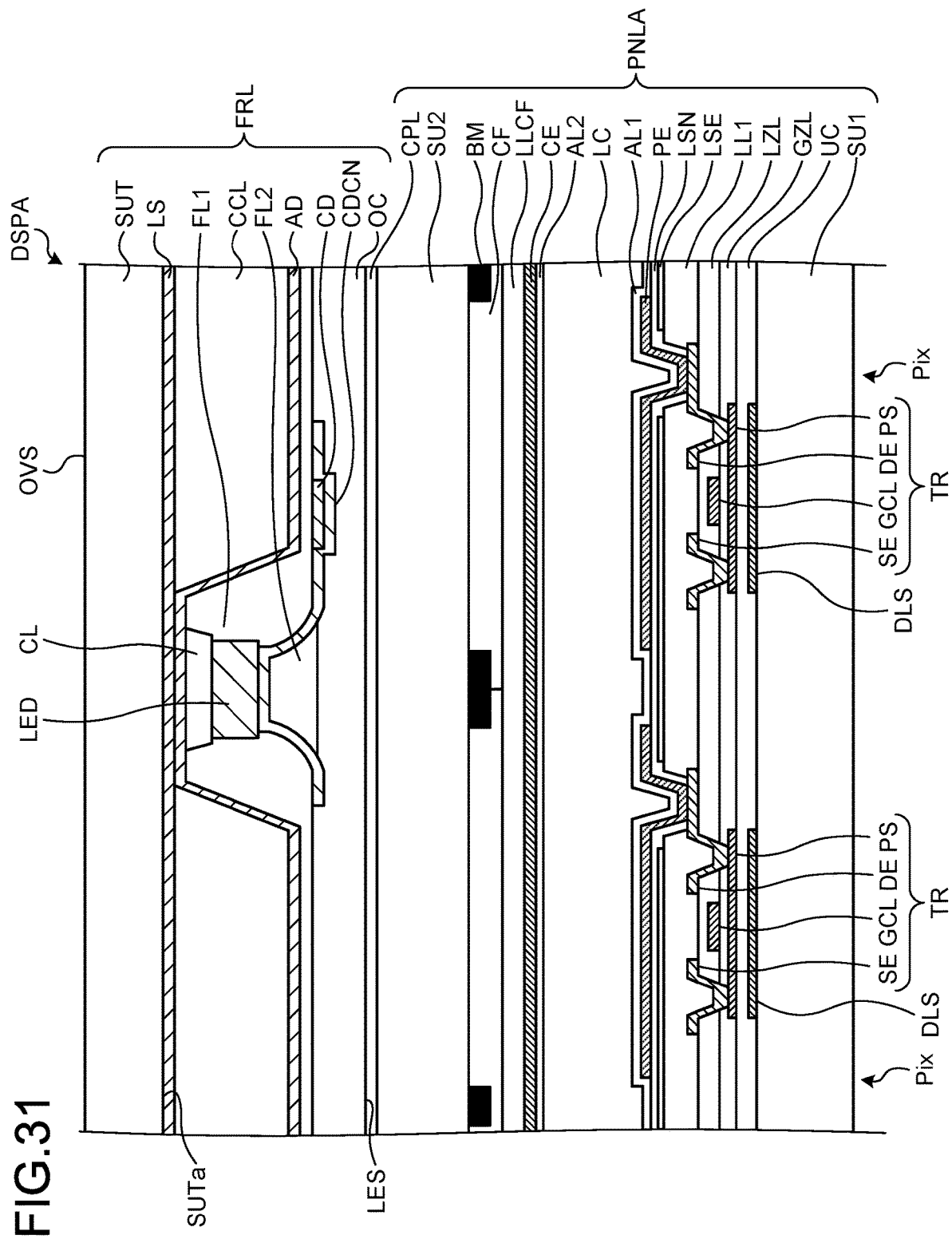
FIG. 31 is a cross-sectional view schematically illustrating a display device including the illumination device in the seventh embodiment.
Figure 32:
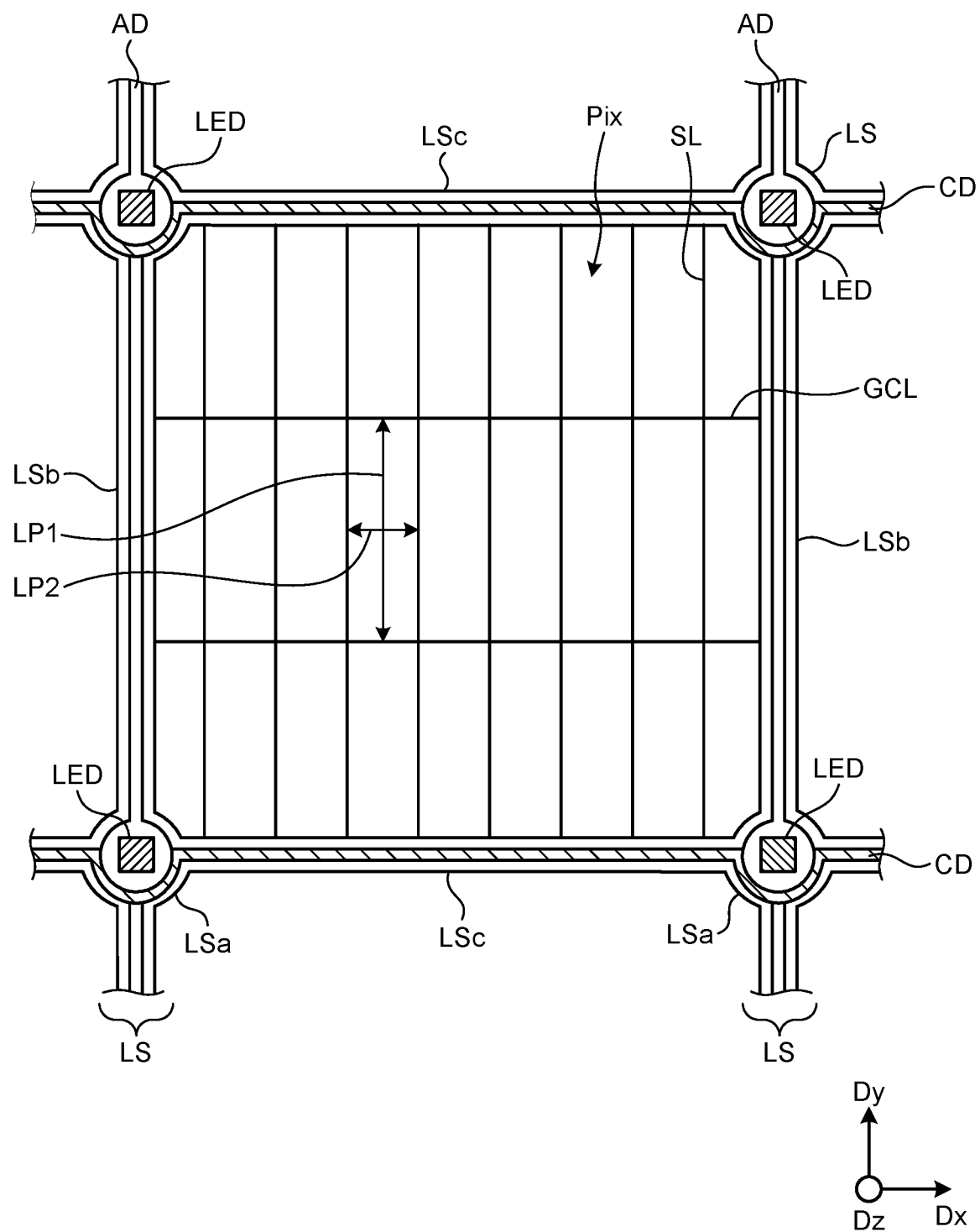
FIG. 32 is a plan view schematically illustrating a display device including the illumination device in the seventh embodiment.

FIG. 31 is a cross-sectional view schematically illustrating a display device including the illumination device in the seventh embodiment. FIG. 32 is a plan view schematically illustrating the display device including the illumination device in the seventh embodiment.

A display device DSPA includes the illumination device FRL and a display unit PNLA as illustrated in FIG. 31. The first substrate SU1 and the second substrate SU2 in the display unit PNLA are insulating substrates and are formed of, for example, a glass substrate, a resin substrate, or a resin film. The first substrate SU1 and the second substrate SU2 are formed of, for example, borosilicate glass.

A light shielding layer DLS, an undercoat layer UC, a semiconductor layer PS, a gate insulating layer GZL, display scan lines GCL, an insulating interlayer LZL, source electrodes SE and drain electrodes DE, a first flattening layer LL1, a counter electrode LSE, a capacitive nitride film LSN, the pixel electrodes PE, and a first orientation film AL1 are stacked on one surface of the first substrate SU1 in the order as listed. The pixel electrode PE contains a metal material that reflects light and has gloss and includes, for example, a multilayered body of an aluminum film and an ITO film. The pixel electrode PE is coupled to the drain electrode DE of drive transistor TR. The pixel electrode PE applies voltage corresponding to an image signal to the liquid crystal layer LC, in combination with the common electrode CE.

A black matrix BM, the color filters CF, a flattening layer LLCF, the common electrode CE, and a second orientation film AL2 are stacked on one surface of the second substrate SU2 in the order as listed. The common electrode CE is formed of, for example, an ITO film.

The liquid crystal layer LC is arranged between the first orientation film AL1 and the second orientation film AL2. Both of the first orientation film AL1 and the second orientation film AL2 are polyimide films having vertical orientation properties. An orientation state of the liquid crystal layer LC is thereby brought into a vertically orientated state; and by a combination of the films and the circular polarizing plate CPL, the display unit PNLA is brought into a dark display state when no voltage is applied. A liquid crystal material having negative dielectric anisotropy is used for the liquid crystal layer LC, thereby providing normally black voltage-reflectivity characteristics.

FIG. 31 illustrates two pixels Pix in an enlarged manner, and the light emitting element LED of the illumination device FRL is arranged above the boundary of the pixels Pix. The black matrix BM is provided at the boundary of the color filters CF on the second substrate SU2. That is to say, the light emitting elements LED are arranged in regions overlapping with the black matrix BM.

FIG. 32 is a see-through plan view when the display device DSPA illustrated in FIG. 31 is seen from the illumination device FRL side. As illustrated in FIG. 32, a plurality of display scan lines GCL and a plurality of display signal lines SL are arrayed so as to intersect with each other. The display scan lines GCL extend in the first direction Dx. The display signal lines SL extend in the second direction Dy. A region surrounded by the display scan lines GCL and the display signal lines SL is configured as one pixel Pix.

A shape of the display unit PNLA is not particularly limited and may be, for example, a horizontally long rectangular shape or a vertically long rectangular shape. The number M×N of the pixels Pix of the display unit PNLA is expressed as (M, N). In this case, when the display unit PNLA has the horizontally long rectangular shape, for example, some image display resolutions such as (640, 480), (800, 600), and (1024, 768) can be exemplified. When the display unit PNLA has the vertically long rectangular shape, resolutions obtained by interchanging the two values thereof can be exemplified.

It is assumed that a length LP1 of the long sides of each pixel Pix is X1 µm and a length LP2 of the short sides of the pixel Pix is X2 µm. Arrangement intervals of the anode electrodes AD and the cathode electrodes CD are the integral multiples of the size of the pixel Pix. In FIG. 32, the arrangement interval of the anode electrodes AD in the first direction Dx is nine times of the length LP2, that is, 9×X2 µm. The arrangement interval of the cathode electrodes CD in the second direction Dy is three times of the length LP1, that is, 3×X1 µm.

The anode electrodes AD extend in a direction parallel to the display signal lines SL and are arranged so as to overlap with the display signal lines SL. The cathode electrodes CD extend in a direction parallel to the display scan lines GCL and are arranged so as to overlap with the display scan lines GCL. A region surrounded by two anode electrodes AD and two cathode electrodes CD includes 27 pixels Pix. In other words, the light emitting elements LED are arranged at four vertices of the square region including 27 pixels Pix.

Arrangement intervals of the light emitting elements LED in the first direction Dx and the second direction Dy are substantially equal to a distance between the light emitting elements LED and the pixel electrodes PE in the third direction Dz.

With this configuration, the light emitting elements LED can be arranged in the display device DSPA with a sufficient arrangement density, and light emitted to the image display surface of the display unit PNLA, that is, the upper surface of the second substrate SU2 can be made uniform. The illumination device FRL and the display unit PNLA are aligned such that the anode electrodes AD and the cathode electrodes CD respectively overlap with the display signal lines SL and the display scan lines GCL, thereby reducing generation of moire. Furthermore, in the display device DSPA, a reduction in aperture ratio can be hampered when seen from the third direction Dz.

In the display device DSPA in the embodiment, it is possible, by combining the illumination device FRL and the display unit PNLA, to hamper a decrease in contrast ratio and color purity even under low illuminance environments, whereby the display can be observed with good quality. The display device DSPA exhibits a constant contrast ratio regardless of the illuminance.

Although the illumination device FRL in the seventh embodiment is provided in FIG. 31, any one of the illumination devices FRL in the above-mentioned first embodiment to sixth embodiment and the respective modifications can be applied.

Eighth Embodiment

FIG. 33 is a cross-sectional view schematically illustrating a display device according to an eighth embodiment. The display elements of the display units PNL and PNLA are not limited to the liquid crystal elements. In a display device DSPB in the eighth embodiment, a display unit PNLB is an electrophoretic display panel using electrophoretic elements as the display elements.

A multilayered structure of the display unit PNLB is similar to that of the display unit PNLA illustrated in FIG. 31. The display unit PNLB does not include the circular polarizing plate CPL, the first orientation film AL1 and the second orientation film AL2 illustrated in FIG. 31. An electrophoretic layer EC is provided instead of the liquid crystal layer LC. The electrophoretic layer EC is arranged between the pixel electrodes PE and the common electrode CE.

The electrophoretic layer EC has a large number of microcapsules MC containing charged white fine particles MWP and a black solution BL. The white fine particles MWP are dispersed in the black solution BL. The white fine particles MWP move in accordance with polarities of electric fields formed between the pixel electrodes PE and the common electrode CE. The display becomes white when the white fine particles MWP move to the second substrate SU2 side, and becomes black when the white fine particles MWP move to the first substrate SU1 side. The drive transistors TR have a high withstand voltage in comparison with that in a reflective liquid crystal display device because a voltage required for movement of the white fine particles MWP is high.

In the display device DSPB in the eighth embodiment, the white fine particles MWP reflect external light or light from the illumination device RFL to display an image. Also in the electrophoretic display device DSPB, it is possible, by combining the illumination device FRL and the display unit PNLB, to hamper a decrease in contrast ratio and color purity even under low illuminance environments, whereby the display can be observed with good quality. The display device DSPB also exhibits a constant contrast ratio regardless of the illuminance.

Although the illumination device FRL in the seventh embodiment is provided in FIG. 33, any one of the illumination devices FRL in the above-mentioned first embodiment to sixth embodiment and the respective modifications can be applied.

Although the preferred embodiments of the present disclosure have been described above, the present disclosure is not limited by these embodiments. Contents disclosed in the embodiments are merely examples, and various modifications can be made in a range without departing from the gist of the present disclosure. It is needless to say that appropriate modifications in a range without departing from the gist of the present disclosure belong to the technical range of the present disclosure. At least one of various omission, replacement, and modification of the components can be performed in a range without departing from the gist of the embodiments and modifications described above.

What is claimed is:

1. An illumination device configured to be arranged opposing an image display surface of a reflective display device, the illumination device comprising:

a translucent substrate;
a resin layer having resin layer openings;
a plurality of light emitting elements that is provided to the translucent substrate, the light emitting elements being arranged in respective resin layer openings;
an anode electrode that is electrically coupled to the light emitting elements; and
a cathode electrode that is electrically coupled to the light emitting elements, wherein
the anode electrode includes:
a plurality of first partial anode electrodes having recessed structures in which the light emitting elements are arranged; and
a second partial anode electrode that has a width less than widths of the first partial anode electrodes and couples the first partial anode electrodes,
the first partial anode electrodes include:
anode electrode bottom portions that are coupled to the light emitting elements; and
anode electrode inclined portions that oppose side surfaces of the light emitting elements and are inclined with respect to the anode electrode bottom portions, such that the recessed structures of the first partial anode electrodes are formed by the anode electrode bottom portions and anode electrode inclined portions surrounding the light emitting elements, and
the resin layer openings include:
resin layer bottom portions in which the anode electrode bottom portions are coupled to the light emitting elements;
wall surfaces that are inclined with respect to the bottom portions and that are in contact with the anode electrode inclined portions, the wall surfaces facing and surrounding side surfaces of the light emitting elements.

2. The illumination device according to claim 1, wherein the cathode electrode includes:
a plurality of first partial cathode electrodes that are provided along outer circumferences of the first partial anode electrodes while being separated from the first partial anode electrodes; and
a second partial cathode electrode that couples the first partial cathode electrodes.

3. The illumination device according to claim 2, wherein
the second partial cathode electrode extends in a first direction,
the second partial anode electrode extends in a second direction intersecting with the first direction, and
the first partial cathode electrodes intersect with the second partial anode electrode in plan view.

4. The illumination device according to claim 2, comprising a light shielding layer provided between the translucent substrate and both the anode electrode and the cathode electrode in a normal direction of the translucent substrate, wherein
the light shielding layer includes:
first partial light shielding layers that overlap with the first partial anode electrodes and the first partial cathode electrodes;
a second partial light shielding layer that overlaps with the second partial anode electrode and has a width less than that of the first partial light shielding layers; and
a third partial light shielding layer that overlaps with the second partial cathode electrode and has a width less than widths of the first partial light shielding layers.

5. The illumination device according to claim 2, wherein the cathode electrode is arranged so as to be adjacent to the anode electrode in a first direction, and the cathode electrode and the anode electrode extend in a second direction intersecting with the first direction.

6. The illumination device according to claim 5, comprising a light shielding layer provided between the translucent substrate and both the anode electrode and the cathode electrode in a normal direction of the translucent substrate, wherein
the light shielding layer includes:
first partial light shielding layers that overlap with the first partial anode electrodes and the first partial cathode electrodes, and
a second partial light shielding layer that overlaps with the second partial anode electrode and the second partial cathode electrode and has a width less than widths of the first partial light shielding layers.

7. The illumination device according to claim 5, comprising:
a flattening layer that is provided on or above the anode electrode and the resin layer and has flattening layer openings in regions overlapping with the light emitting elements,
wherein
the flattening layer cover the anode electrodes disposed on the resin layer in such manner that the resin layer openings are filled with the flattening layer,
the cathode electrode and the second partial anode electrode are provided on or above the resin layer, and
the cathode electrode is electrically coupled to the light emitting elements through cathode coupling lines provided on or above the flattening layer.

8. The illumination device according to claim 1, comprising:
a flattening layer that is provided on or above the anode electrode and has flattening layer openings in regions overlapping with the light emitting elements, and
a light shielding layer that is provided between the translucent substrate and both the anode electrode and the cathode electrode in a normal direction of the translucent substrate, wherein
the flattening layer cover the anode electrodes disposed on the resin layer in such manner that the resin layer openings are filled with the flattening layer,
the light shielding layer includes:
a first light shielding layer that is provided in a region overlapping with the anode electrode and is provided between the translucent substrate and the anode electrode, and
a second light shielding layer that is provided in a region overlapping with the cathode electrode and is provided between the flattening layer and the cathode electrode.

9. The illumination device according to claim 8, wherein the anode electrode and the first light shielding layer have the same width in plan view.

10. The illumination device according to claim 1, wherein the cathode electrode is provided continuously to a light emission surface to which light from the light emitting elements is emitted and across a plurality of the anode electrodes and the light emitting elements.

11. The illumination device according to claim 1, wherein the light emitting elements and the first partial anode electrodes are provided randomly to the translucent substrate.

12. The illumination device according to claim 1, comprising:
- a flattening layer that is provided on or above the anode electrode and has flattening layer openings in regions overlapping with the light emitting elements; and
- an inorganic insulating layer having translucency and covering the anode electrode and at least parts of the light emitting elements,
- wherein
- a refractive index of the inorganic insulating layer is greater than a refractive index of the flattening layer that is in contact with the flattening layer.

13. The illumination device according to claim 12, wherein a plurality of recesses or a plurality of projections are provided in or on a surface of the inorganic insulating layer.

14. The illumination device according to claim 1, comprising a phosphor layer covering side surfaces of the light emitting elements and provided in the recessed structures of the anode electrode.

15. A display device comprising:
- the illumination device according to claim 1; and
- a display unit that displays an image with light emitted from the illumination device.

16. The display device according to claim 15, wherein the display unit includes:
- a plurality of pixels;
- a scan line supplying a scan signal to the pixels; and
- a signal line supplying a pixel signal to the pixels, and
- the signal line is provided so as to overlap with the anode electrode and the scan line is provided so as to overlap with the cathode electrode in plan view.

17. The illumination device according to claim 1, comprising:
- a flattening layer that is provided on or above the anode electrode and has flattening layer openings in regions overlapping with the light emitting elements; and
- a light shielding layer including a first light shielding layer that is provided in a region overlapping with the anode electrode and is provided between the translucent substrate and the anode electrode in a normal direction of the translucent substrate; and
- an inorganic insulating layer having translucency and covering the anode electrode and at least parts of the light emitting elements,
- wherein the anode electrode inclined portions are disposed, in the normal direction of the translucent substrate, between:
- the first light shielding layer on the translucent substrate; and
- the inorganic insulating layer under the flattening layer that has a refractive index less than a refractive index of the inorganic insulating layer.

* * * * *